(12) United States Patent
Ferry et al.

(10) Patent No.: US 11,749,770 B2
(45) Date of Patent: Sep. 5, 2023

(54) TRUE HOT-CARRIER SOLAR CELL AND HOT-CARRIER TRANSFER

(71) Applicants: ARIZONA BOARD OF REGENTS ON BEHALF OF ARIZONA STATE UNIVERSITY, Scottsdale, AZ (US); The Board of Regents of the University of Oklahoma, Norman, OK (US)

(72) Inventors: David Ferry, Scottsdale, AZ (US); Vincent Whiteside, Buffalo, NY (US); Ian R. Sellers, Norman, OK (US)

(73) Assignees: Arizona Board of Regents on behalf of Arizona State University, Scottsdale, AZ (US); The Board of Regents of the University of Oklahoma, Norman, OK (US)

( * ) Notice: Subject to any disclaimer, the term of this patent is extended or adjusted under 35 U.S.C. 154(b) by 0 days.

(21) Appl. No.: 17/285,360

(22) PCT Filed: Oct. 14, 2019

(86) PCT No.: PCT/US2019/056091
§ 371 (c)(1),
(2) Date: Apr. 14, 2021

(87) PCT Pub. No.: WO2020/081441
PCT Pub. Date: Apr. 23, 2020

(65) Prior Publication Data
US 2021/0359151 A1    Nov. 18, 2021

Related U.S. Application Data

(60) Provisional application No. 62/745,836, filed on Oct. 15, 2018, provisional application No. 62/746,645, (Continued)

(51) Int. Cl.
*H01L 31/0735* (2012.01)

(52) U.S. Cl.
CPC .............................. *H01L 31/0735* (2013.01)

(58) Field of Classification Search
CPC ................................................... H01L 31/0735
See application file for complete search history.

(56) References Cited

U.S. PATENT DOCUMENTS

| 4,872,038 A | 10/1989 | Bernstein |
| 4,877,716 A | 10/1989 | Bernstein |
| (Continued) | | |

OTHER PUBLICATIONS

Sari, H., et al. "DX centers in In x Al 1- x As." Journal of Applied Physics 85.6 (1999): 3380-3382.
(Continued)

*Primary Examiner* — Tamir Ayad
(74) *Attorney, Agent, or Firm* — Conley Rose, P.C.; Grant Rodolph; Jonathan K. Polk

(57) ABSTRACT

A photovoltaic device configured to substantially avoid radiative recombination of photo-generated carriers, reduce loss of energy of the photo-generated carriers through the phonon emission, extract photo-generated carriers substantially exclusively from the multi-frequency satellite valley (s) of the bandstructure of the used semiconductor material as opposed to the single predetermined extremum of the bandstructure. Methodologies of fabrication and operation of such a device.

11 Claims, 11 Drawing Sheets

Related U.S. Application Data filed on Oct. 17, 2018, provisional application No. 62/756,224, filed on Nov. 6, 2018.

(56) References Cited

U.S. PATENT DOCUMENTS

| | | | |
|---|---|---|---|
| 4,937,174 | A | 6/1990 | Bernstein |
| 6,005,261 | A | 12/1999 | Konstantinov |
| 6,147,391 | A | 11/2000 | Bowers |
| 2003/0089958 | A1* | 5/2003 | Gutierrez-Aitken ......................... H01L 31/101 257/E31.022 |
| 2004/0104410 | A1 | 6/2004 | Gilbert |
| 2009/0145476 | A1 | 6/2009 | Fetzer |
| 2012/0104460 | A1 | 5/2012 | Nie |
| 2013/0161653 | A1 | 6/2013 | Park |
| 2015/0162478 | A1 | 6/2015 | Ffafard |

OTHER PUBLICATIONS

Shah, J., et al. "Determination of intervalley scattering rates in GaAs by subpicosecond luminescence spectroscopy." Physical review letters 59.19 (1987): 2222.
Shah, J. "Hot carriers in quasi-2-D polar semiconductors." IEEE journal of quantum electronics 22.9 (1986) 1728-1743.
Shockley et al, "Detailed balance limit of efficiency of p-n junction solar cells" Journal of Applied Physics, vol. 32, p510, 1961.
Spitzer, J., et al. "Influence of the interface composition of InAs/AlSb superlattices on their optical and structural properties." Journal of applied physics 77.2 (1995): 811-820.
Takeda, Y., et al. "Hot carrier solar cells operating under practical conditions." Journal of Applied Physics 105.7 (2009): 074905.
Tang, J., et al. "Effects of localization on hot carriers in InAs/AlAs x Sb1-x quantum wells." Applied Physics Letters 106.6 (2015): 061902.
Tsen, K.-T., et al. "Transient subpicosecond Raman studies of electron velocity overshoot in an InP p-i-n nanostructure semiconductor." Applied physics letters 69.23 (1996): 3575-3577.
Whiteside, V. R., et al. "The role of intervalley phonons in hot carrier transfer and extraction in type-II InAs/AlAsSb quantum-well solar cells." Semiconductor Science and Technology 34.9 (2019): 094001.
Whiteside, V. R., et al. "Valence band states in an InAs/AlAsSb multi-quantum well hot carrier absorber." Semiconductor Science and Technology 34.2 (2019): 025005.
Wurfel, P., et al. "Particle conservation in the hot-carrier solar cell." Progress in Photovoltaics: Research and Applications 13.4 (2005): 277-285.
Wurfel, P. "The chemical potential of radiation." Journal of Physics C: Solid State Physics 15.18 (1982): 3967.
Yao, Y. et al. "Comparison of bulk material candidates for hot carrier absorber." Solar Energy Materials and Solar Cells 140 (2015): 422-427.
Zhang, P., et al. "Generation of hot carrier population in colloidal silicon quantum dots for high-efficiency photovoltaics." Solar Energy Materials and Solar Cells 145 (2016): 391-396.
Zibik, E. A., et al. "Long lifetimes of quantum-dot intersublevel transitions in the terahertz range." Nature materials 8.10 (2009): 803-807.
Akis, R., et al. "Full-band cellular Monte Carlo simulations of terahertz high electron mobility transistors." Journal of Physics: Condensed Matter 20.38 (2008): 384201.
Aliberti, P., et al. "Investigation of theoretical efficiency limit of hot carriers solar cells with a bulk indium nitride absorber." Journal of Applied Physics 108.9 (2010): 094507.
Almosni, S., et al. "Material challenges for solar cells in the twenty-first century: directions in emerging technologies." Science and Technology of advanced MaTerialS 19.1 (2018): 336-369.

Auston, D. H., et al. "Picosecond ellipsometry of transient electron-hole plasmas in germanium." Physical Review Letters 32.20 (1974): 1120.
Ayubi-Moak, J. S., et al. "Simulation of ultrasubmicrometer-gate In0. 52Al0. 48As/In0. 75Ga0. 25As/In0. 52Al0. 48As/InP pseudomorphic HEMTs using a full-band monte carlo simulator: Simulation and modeling of nanoelectronics devices." IEEE transactions on electron devices 54.9 (2007): 2327-2338.
Barman, S., et al. (2004). Long-wavelength nonequilibrium optical phonon dynamics in cubic and hexagonal semiconductors. Physical Review B, 69(23), 235208.
Chung, S., et al. "Nanosecond long excited state lifetimes observed in hafnium nitride." Solar Energy Materials and Solar Cells 169 (2017): 13-18.
Clady, R., et al. "Interplay between the hot phonon effect and intervalley scattering on the cooling rate of hot carriers in GaAs and InP." Progress in Photovoltaics: Research and Applications 20.1 (2012): 82-92.
Conibeer. et al. "Slowing of carrier cooling in hot carrier solar cells." Thin solid films 516.20 (2008): 6948-6953.
Conibeer. et al. "Modelling of hot carrier solar cell absorbers." Solar energy materials and solar cells 94.9 (2010): 1516-1521.
Conibeer. et al. "Progress on hot carrier cells," Sol. Energy Mater. Sol. Cells vol. 93, pp. 713-719, 2009.
Dimmock, et al., "Demonstralion of a hot-carrier photovoltaic cell," Progress in Photovoltaics: Research & Applications, vol. 22, pp. 151-160, 2014.
Dimmock, et al. "Optoelectronic characterization of carrier extraction in a hot carrier photovoltaic cell structure." Journal of Optics 18.7 (2016): 074003.
Esmaielpour, H., et al. "Enhanced Hot Electron Lifetimes in Quantum Wells With Inhibited Phonon Coupling." Scientific reports 8.1 (2018): 12473.
Esmaielpour, H., et al. "Hot Carrier Solar Cells based on Inter-Valley Phonon Scattering: A New Approach towards a Practical Solution." 2019 IEEE 46th Photovoltaic Specialists Conference (PVSC). IEEE, 2019.
Esmaielpour, H., et al. "Suppression of phonon-mediated hot carrier relaxation in type-II InAs/AlAsxSb1- x quantum wells: a practical route to hot carrier solar cells." Progress in Photovoltaics: Research and Applications 24.5 (2016): 591-599.
Esmaielpour, H., et al. "The effect of an InP cap layer on the photoluminescence of an In x Ga1-x As1-y P y/In z Al1-z As quantum well heterostructure." Journal of Applied Physics 121.23 (2017): 235301.
Ferry, D. K. "In search of a true hot carrier solar cell." Semiconductor Science and Technology 34.4 (2019): 044001.
Fischetti, M. V., et al. "Theory and calculation of the deformation potential electron-phonon scattering rates in semiconductors." Monte Carlo Device Simulation. Springer, Boston, MA, 1991. 123-160.
Fröhlich, H. et al. "XX. Properties of slow electrons in polar materials." The London, Edinburgh, and Dublin Philosophical Magazine and Journal of Science 41.314 (1950): 221-242.
Gibelli, F. et al. "Accurate radiation temperature and chemical potential from quantitative photoluminescence analysis of hot carrier populations." Journal of Physics: Condensed Matter 29.6 (2016): 06LT02.
Grann, E. D., et al. "Nonequilibrium phonon dynamics and electron distribution functions in InP and InAs." Physical Review B 53.15 (1996): 9847.
Grann, E. D., et al. "Transient picosecond Raman studies of high-field electron transport in GaAs-based p-i-n nanostructure semiconductors." Physical Review B 51.3 (1995): 1631.
Gunn, J. B. "Microwave oscillations of current in III-V semiconductors." Solid State Communications 1.4 (1963) 88-91.
Harada, Y., et al. "Nanosecond-scale hot-carrier cooling dynamics in one-dimensional quantum dot superlattices." Physical Review B 93.11 (2016): 115303.
Hatami, F., et al. "Radiative recombination in type-II GaSb/GaAs quantum dots." Applied physics letters 67.5 (1995) 656-658.
Hirst, L. C., et al. "Enhanced hot-carrier effects in InAlAs/InGaAs quantum wells." IEEE Journal of Photovoltaics 4.6 (2014): 1526-1531.

(56) References Cited

OTHER PUBLICATIONS

Hirst, L. C., et al. "Experimental demonstration of hot-carrier photo-current in an InGaAs quantum well solar cell." Applied Physics Letters 104.23 (2014): 231115.
Hirst, L. C., et al. "Hot carriers in quantum wells for photovoltaic efficiency enhancement." IEEE Journal of Photovoltaics 4.1 (2013): 244-252.
Ioffe.ru. Band Structure and Carrier Concentration. Webpage. Version accessed Sep. 7, 2018. Available online at https://web.archive.org/web/20180907122845/http://www.ioffe.ru/SVA/NSM/Semicond/InAs/bandstr.html#Masses. 4 pages.
International Searching Authority. International Search Report and Written Opinion for application PCT/US2019/056091. dated Mar. 12, 2020. 14 pages.
Kash, K., et al. "Picosecond luminescence measurements of hot carrier relaxation in III-V semiconductors using sum frequency generation." Physica B+ C 134.1-3 (1985): 189-198.
Kirk, A. P., et al. "Fundamental limitations of hot-carrier solar cells." Physical Review B 86.16 (2012): 165206.
Klemens, P. G. "Anharmonic decay of optical phonons." Physical Review 148.2 (1966): 845.
Konovalov, I., et al. "Hot carrier solar cell with semi infinite energy filtering." Solar Energy 111 (2015): 1-9.
Kroemer, H. "The 6.1 Å family (InAs, GaSb, AlSb) and its heterostructures: a selective review." Physica E: Low-dimensional Systems and Nanostructures 20.3-4 (2004): 196-203.
Le Bris, A., et al. "Thermalisation rate study of GaSb-based heterostructures by continuous wave photoluminescence and their potential as hot carrier solar cell absorbers." Energy & Environmental Science 5.3 (2012): 6225-6232.
Lindsay, L., et al. "Ab initio thermal transport in compound semiconductors." Physical Review B 87.16 (2013) 165201.
Lugli, "Non-equilibrium longitudinal-optical phonon effects in GaAs-AlGaAs quantum wells," Physical Review Letters, vol. 59, pp. 716-719, 1987.
Lumb, M. P., et al. "Quantum wells and superlattices for III-V photovoltaics and photodetectors." Next Generation (Nano) Photonic and Cell Technologies for Solar Energy Conversion III. vol. 8471. International Society for Optics and Photonics, 2012.
Matthews, J. W., et al. "Defects in epitaxial multilayers: I. Misfit dislocations." Journal of Crystal growth 27 (1974): 118-125.
Murdin, B. N., et al. "Direct observation of the Io phonon bottleneck in wide GaAs/Al x Ga 1- x As quantum wells." Physical Review B 55.8 (1997): 5171.
Nguyen, et al, "Quantitative experimental assessment of hot carrier-enhanced solar cells at room temperature," Nature Energy, vol. 3, pp. 236-241, 2018.
Ridley et al, "The Possibility of Negative Resistance Effects in Semiconductors," Proceedings of the Physical Society vo. 78, p. 293, 1961.
Ridley, B. K. "The LO phonon lifetime in GaN." Journal of Physics: Condensed Matter 8.37 (1996): L511.
Rodière, J, et al. "Experimental evidence of hot carriers solar cell operation in multi-quantum wells heterostructures." Applied Physics Letters 106.18 (2015): 183901.
Rosenwaks et al., "Hot-carrier cooling in GaAs: quantum wells versus bulk," Physical Review B. vol. 48, pp. 14675-14678, 1993.
Ross, R. T. et al. "Efficiency of hot-carrier solar energy converters." Journal of Applied Physics 53.5 (1982): 3813-3818.
Ryan, J. F., et al. "Time-resolved photoluminescence of two-dimensional hot carriers in GaAs-AlGaAs heterostructures." Physical review letters 53.19 (1984): 1841.
Ryder, E. J. "Mobility of holes and electrons in high electric fields." Physical Review 90.5 (1953): 766.

\* cited by examiner

Table 1. Parameter values.

| | InGaAs | InAlAs |
|---|---|---|
| $J_{abs}$ (photons s$^{-1}$ m$^{-3}$) | $3.85 \times 10^{21}$ | $2.93 \times 10^{21}$ |
| $\Delta n$ (m$^{-3}$) | $3.85 \times 10^{16}$ | $2.93 \times 10^{16}$ |
| $\Delta p$ (m$^{-3}$) | $3.85 \times 10^{16}$ | $2.93 \times 10^{16}$ |
| $T_{e,L}$ (K) | 930 | 1150 |
| $T_{e,\Gamma}$ (K) | 1780 | 2000 |
| $T_{h,\Gamma}$ (K) | 500 | 500 |
| $\mu_{e,L}$ (eV *below* L) | 0.75 | 1.0 |
| $\mu_{e,\Gamma}$ (eV *below* Γ) | 1.1 | 1.5 |
| $\mu_{h,\Gamma}$ (eV *above* Γ) | 0.36 | 0.34 |
| $J_{em}$ (photons s$^{-1}$ m$^{-3}$) | $1.6 \times 10^{18}$ | $2.93 \times 10^{18}$ |
| $V_o$ (V) | 1.1 | 1.37 |
| $V_b$ (V) | 0.2 | 0.19 |
| $U_{abs}$ (W m$^{-2}$) | 998 | 709 |
| $\eta$ (%) | >45 | >75 |

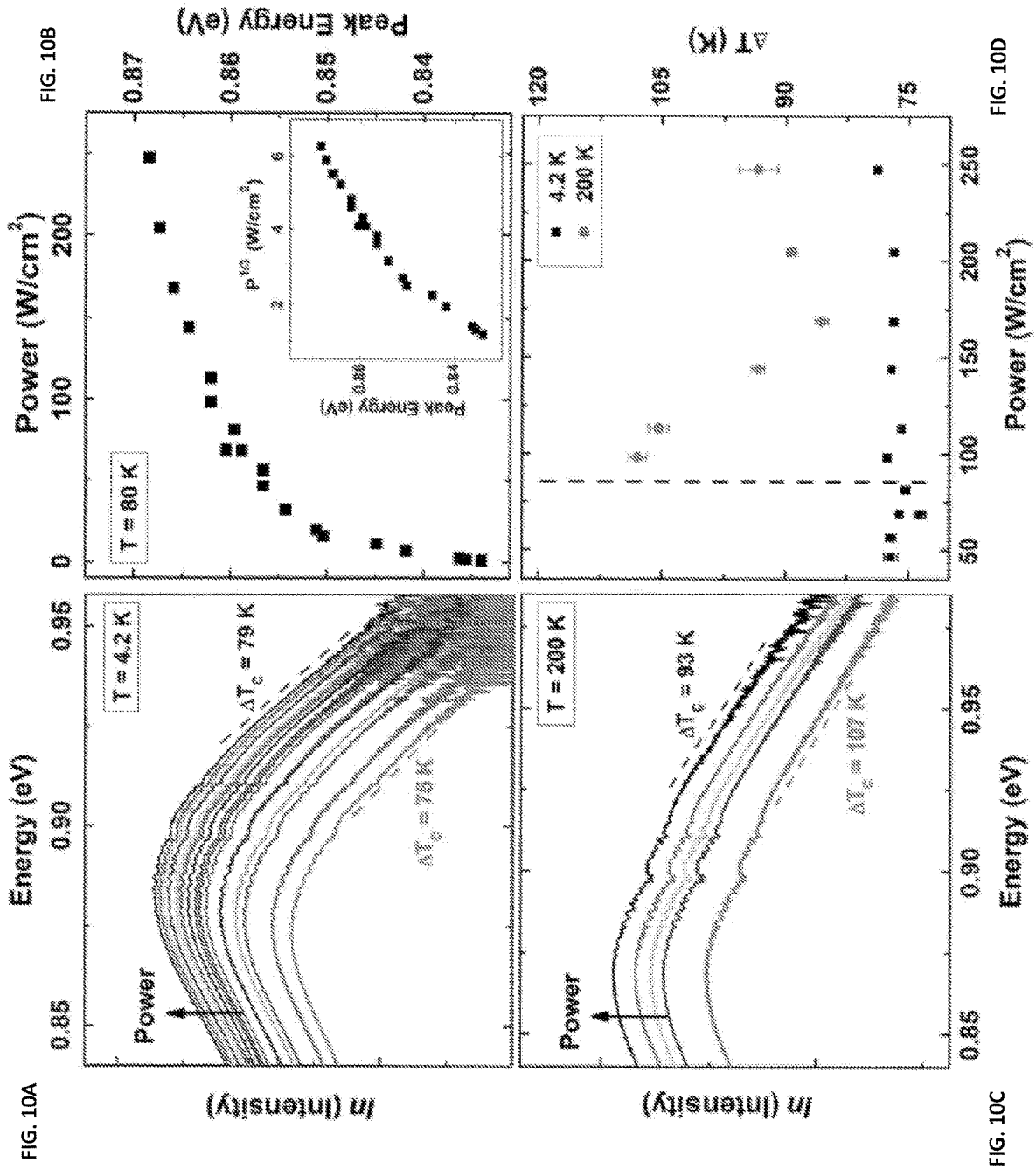

TRUE HOT-CARRIER SOLAR CELL AND HOT-CARRIER TRANSFER

CROSS-REFERENCE TO RELATED APPLICATIONS

The present application is a US national phase of the international application No. PCT/US2019/056091 filed on Oct. 14, 2019 and now published as WO 2020/081441, which claims priority from the U.S. Provisional Applications No. 62/745,836 filed on Oct. 15, 2018; No. 62/746,645 filed on Oct. 17, 2018; and No. 62/756,224 filed on Nov. 6, 2018. The disclosure of each of the above-identified patent applications is incorporated herein by reference.

GOVERNMENT RIGHTS

This invention was made with government support under Contract Number 1610062 awarded by the National Science Foundation. The government has certain rights in the invention.

TECHNICAL FIELD

The present invention pertains to the field of solar energy conversion and, in particular, to photovoltaic devices configured to substantially avoid radiative recombination of the photo-generated carriers, reduce loss of energy of the photo-generated carriers through the phonon emission, extract photo-generated carriers substantially exclusively from the multi-frequency satellite valley(s) of the bandstructure of the used semiconductor material as opposed to the single pre-determined extremum of the bandstructure, to reduce thermalization losses and extract useful energy by suppressing heat generation.

RELATED ART

In the years since the solar industry began and expanded to its current state, no single junction solar cell has yet reached the so-called Shockley-Queisser limit in efficiency. This limit is set by the thermodynamics of the solar-energy absorption process and the rapid decay of photo-excited carriers to the band edges, where they are extracted with a voltage limited by the band gap of the semiconductor involved.

The decay of the photo-excited carriers to the band edge involves the emission of optical phonons by the electrons and holes. Such emission conducts/relays/transfers the photo-energy to the lattice of the semiconductor material(s), where the energy is lost to the energy-conversion process. Indeed, it is estimated that almost half of the absorbed solar energy in the cell is lost to this phonon emission process. (Notably, only multi-junction cells, where each junction absorbs a different part of the solar spectrum has moved beyond this limit, but not markedly so.) Roughly another quarter of the absorbed solar energy is lost to the heat generation in the contacts. Currently, the conversion efficiency of single-junction Si-based solar cells is less than 30% efficiency, while the efficiency of multi-junction cells is on the order of 45%.

Ross and Nozik (J. Appl. Phys. 53, 3813, 1982) proposed that a hot-carrier solar cell (HCSC) could conceivably produce efficiency near 85%. Consequently, HCSC has become a prospect for the so-called third generation solar cell. The following recipe was prescribed to reach such high levels of efficiency: (1) to prevent the photo-generated carriers from thermalizing to the band edges by optical phonon emission, and (2) to extract only the hot carriers into the contacts through an energy-selective contact.

Since 1982, a great deal of effort has been expended on phononic engineering to attempts to reduce the emission of optical phonons by the carriers, as well as on devising fancy multi-layer heterostructures to create the energy-selective contact (which is required to have a narrow band of energies allowed into the contact).

However, the prudency and efficacy of such approach(es) has been questioned by the results of detailed simulations of HCSC, which indicate that the energy-selective contact approach may well be limited to <2% efficiency (see A. P. Kirk and M. V. Fischetti, Phys. Rev. B 86, 165206, 2012)). In spite of such demonstrated limitations, work on the HCSC continues unabated.

Related art convincingly shows that practitioners continue to define their solution based on and/or in terms of semiconductor band diagrams with only the central, single conduction band minimum and/or the single valence band maximum.

SUMMARY

Proposed is a hot carrier solar cell constructed to utilize the true hot-carrier properties of the photo-excited carriers more efficiently than is currently done in related art while, at the same time, avoiding (and being free from, devoid of) massive efforts of related art that are directed to creation of phonon bottlenecks or energy-selective filters. Advantageously, the proposed embodiments are directed to continue to utilize standard approaches when fabricating the HCSC while nonetheless achieving an enhanced efficiency through non-obvious heterojunction and band engineering.

In contradistinction with the principles advocated by related art, the idea of the present invention stems from the realization that the use of the entire band structure for the absorber material of the solar cell (and, in particular, the satellite valleys as opposed to the centrally-located conduction band minimum) leads to a dramatic reduction of the emission of optical phonons and—according to a conservative estimates—achieves efficiencies of 55% (or even greater) for HCSC as a result of substantial elimination of most of the optical phonon loss.

Embodiments of the invention provide a photovoltaic device that includes first and second layers forming a p-n junction that has first and second sides and that is structured such that substantially all of a depletion region is located on the second side of the p-n junction defined by the second layer. This second layer includes an absorbing layer, which is configured, in operation of the device, to congregate a substantial majority of photo-generated carriers at a first meta-stable energy level that is higher than an energy level of a bottom of direct-gap conduction band of a material of the absorbing layer. The absorbing layer is under material strain defined to substantially match a lattice constant of said absorbing layer to a lattice constant of the first layers. (In one embodiment, such strain does not exceed 3%, more preferably it does not exceed 0.1%.) In addition, the absorbing layer has a first thickness that is smaller than a second thickness of the depletion region. In one implementation, adjoining the absorbing layer a carrier-extraction layer is formed that has a corresponding band gap having a conduction band at an energy level substantially equal to the first meta-stable energy level. Such carrier-extraction layer is configured as a semi-infinite energy collector. Alternatively or in addition, the device may include an auxiliary layer between the carrier-extraction layer and the absorber layer. Alternatively or in addition, a doping type of the carrier-extraction layer may be the same as a doping type of the absorbing layer. Alternatively or in addition, the device may be structured to satisfy at least one of the following conditions is satisfied: a) a thickness of the carrier-extraction layer is smaller than a thickness of the absorbing layer; and b) the thickness of the absorbing layer is equal to or smaller than a diffusion length of the photo-generated carriers. (In one specific implementation of this latter case, at least one of the following conditions may be satisfied: —the thickness of the carrier-extraction layer is about 10 nm; and —the thickness of the absorbing layer is about 200 nm.) Alternatively or in addition, the photovoltaic device is structured such that first and second electric fields exceed 10 kV/cm (here, the first electric field is a filed caused by a built-in electric potential of the p-n junction, while the second electric field is a field at an interface between the absorption layer and the carrier-extraction layer.) Substantially in any implementation, a contact layer (of degenerate semiconductor material) may be present such that the carrier-extraction layer is between the absorbing layer and the layer of degenerate semiconductor material. (When this is the case, the contact layer is generally configured to terminate the depletion region.) In practically every embodiment, a first concentration of dopants in the absorbing layer is preferably made not to be substantially higher than $10^{16}$ cm$^{-3}$, while a second concentration of dopants in the carrier-extraction layer is preferably made not to be substantially lower than $10^{18}$ cm$^{-3}$. In one case, the absorbing layer is the n-doped layer. Alternatively or in addition, the first thickness may be made smaller than a thickness sufficient for substantial relaxation of the strain to a level below 0.10%. In one case, the conduction band of the carrier-extraction layer has a valence band that lies below a valence band of the absorbing layer.

Embodiments of the invention further provide a photovoltaic device that includes first and second layers forming a p-n junction (that has first and second sides and that is configured such that substantially all of a depletion region is located on the second side of the p-n junction defined by the second layer). The second layer includes an absorbing layer, which is configured, in operation of the device, to congregate a substantial majority of photo-generated carriers at a first meta-stable energy level that is higher than an energy level of a bottom of direct-gap conduction band of a material of the absorbing layer. This absorbing layer is under material strain defined to substantially match a lattice constant of said layer to a lattice constant of another of the first and second layers. The photovoltaic device additionally includes a third layer adjoining the absorbing layer and structured as a semi-infinite energy collector, which has a corresponding band gap with a conduction band at an energy level substantially equal to the first meta-stable energy level. The third layer is substantially thinner than the absorbing layer. The third layer may be doped with a dopant at a concentration sufficient to substantially align a quasi-Fermi level of an L-satellite valley or an X-satellite valley of a band structure of the absorber layer with a quasi-Fermi level of an lower mass valley in the third layer. Alternatively or in addition, the absorbing layer may be structured to have a thickness that is smaller than a thickness of the depletion region, and/or at least one of the following conditions may be satisfied: a) a thickness of the third layer is smaller than a thickness of the absorbing layer; b) the thickness of the absorbing layer is equal to or smaller than a diffusion length of the photo-generated carriers; and c) both first and second electric fields exceed 10 kV/cm, (here, the first electric field is a filed caused by a built-in electric potential of the p-n junction and the second electric field is a field at an interface between the absorption layer and the third layer. (Here, in a specific case, the thickness of the third layer can be made about 10 nm and the thickness of the absorbing layer can be made about 200 nm.) Alternatively or in addition, the embodiment may include a contact layer of a degenerate semiconductor material disposed such that the third layer is sandwiched between the absorbing layer and the contact layer of degenerate semiconductor material; and/or the third layer may be configured to terminate the depletion region; and/or the thickness of the absorbing layer may be chosen to be smaller than that sufficient for substantial relaxation of said strain to a level below 0.1%.

Embodiments further provide a method for operation of a photovoltaic device. This method includes maintaining a substantial majority of photo-generated carriers at at least one first energy level that is higher than an energy level corresponding to a bottom of a conduction band of an absorbing layer of the device, as well as transferring the substantial majority of the photo-generated carriers to a second energy level representing a bottom of the conduction band of a carrier-extraction layer of the device. (The bandgap of the carrier-extraction layer is defined such as to make the second energy level to be substantially equal to the at least one first energy level.) The method additionally includes a step of removing an electric charge of the transferred photo-generated carriers through a layer of degenerated semiconductor in contact with the carrier-extraction layer. (This mechanism results in an operating voltage defined by the energy of the selective emitter— upper energy level—rather than the absorber band gap.) In a specific case, the step of maintaining may include collecting a substantial majority of the photo-generated carriers through at least one of i) an intervalley scattering via either high-energy photoexcitation, and ii) an acceleration of the photo-generated carriers at the conduction band minima by increasing kinetic energy of the photo-generated carriers to said at least one first energy level. Alternatively or in addition, the process of collecting may include a step of returning the photo-generated carriers that relaxed to the bottom of the conduction band of the absorbing layer to the at least one first energy level as a result of the absorbing layer being thinner than a depletion layer of a p-n junction of the device.

Embodiments additionally provide a method for fabrication of a photovoltaic device. The fabrication generally includes a process of forming a stack that structured to contain a first heavily-doped semiconductor layer and a second lightly-doped semiconductor layer to form an interface therebetween and a p-n junction (a type of doping of the first layer is different from a type of doping of the second layer), as well as a process of growing a third heavily-doped layer to be carried by the stack (notably, the third layer is doped with a type of doping that is the same as the type of doping of the second layer) in order to form a depletion region that is thicker than the second layer. Here, a major part of the resulting depletion region is located in the second layer. In a specific case, a thickness of the second layer may be made smaller than a thickness at which a strain of the second layer is reduced below 0.1%. Alternatively or in addition, the process of growing may include growing the third layer under conditions that cause a quasi-Fermi level of the third layer to be substantially aligned with a quasi-Fermi level of that of satellite L-valley and a satellite X-valley which has a heavier mass. In substantially any implementation of the method, the steps of forming and growing may be accomplished under conditions that result in both first and second electric fields exceeding 10 kV/cm (here, the first electric field is a field formed by a built-in potential of the p-n junction and the second electric field is a field at an interface between the second and third layers. Alternatively or in addition—and in any embodiment—the second layer can be made to have a thickness that is at least an order of magnitude larger than a thickness of the third layer, as a result of forming and growing.

BRIEF DESCRIPTION OF THE DRAWINGS

The invention will be more fully understood by referring to the following Detailed Description of Specific Embodiments in conjunction with the not-to scale Drawings, of which:

FIGS. 10A, 10B, 10C, and 10D illustrates plots representing: —power dependent photoluminescence at: 4.2 K (FIG. 10A) and 200 K (FIG. 10C); —peak PL energy versus power at 80 K, FIG. 10B. The inset of FIG. 10B also shows the P1/3 dependence of this response; and Carrier temperature difference ($\Delta$T) versus excitation power at 4.2 K (solid squares) and 200 K (solid circles), FIG. 10D.

FIG. 11A: bandstructure of InAs calculated using the empirical pseudopotential method. FIG. 11B: bandstructure of AlAsSb calculated using the empirical pseudopotential method. FIG. 11C: Schematic of the energy band offsets of the InAs/AlAsSb QWs illustrating the relative position of the $\Gamma$-, L-, and X-valleys. Also shown are the position of the ground and first excited states in the QWs. FIG. 11D: Scattering rates versus energy for polar optical (emission: green and absorption: red) and acoustic phonons, and impurity centers in InAs at 300 K. FIG. 11E: Comparison of the scattering rates as a function of energy (for both emission: green, cyan, saffron and absorption: red, blue, magenta) for polar optical phonons and intervalley phonons in InAs at 300 K. FIG. 11F: Occupation probability in the $\Gamma$- and L-valleys as a function of electric field in InAs at 300 K.

Generally, the sizes and relative scales of elements in Drawings may be set to be different from actual ones to appropriately facilitate simplicity, clarity, and understanding of the Drawings. For the same reason, not all elements present in one Drawing may necessarily be shown in another.

DETAILED DESCRIPTION

Previous attempts to develop the HCSC were extremely limited by the failure of the investigators to examine the proper condensed matter physics and band structure of materials for use in constriction of the GCSC. The present invention addresses this problem and describes the practical methodology of using of the entire band structure for the absorber material can be used to give realistic, and conservative, estimates of achieving higher efficiencies for HCSC. In solving the problem persisting in related art, this invention proposes a hot carrier solar cell judiciously structured to utilize the true hot carrier properties of the photo-excited carriers more efficiently while, at the same time, avoiding (and being free from, devoid of) massive efforts of related art directed to creation of phonon bottlenecks or energy-selective filters. The proposed embodiments are directed to continue to utilize standard approaches when fabricating the HCSC while achieving an enhanced efficiency through non-obvious heterojunction and band engineering.

In contradistinction with the principles advocated by related art, the idea of the present invention stems from the realization that the use of the entire band structure for the absorber material of the photovoltaic device such as, in one non-limiting example, as solar cell (and, in particular, the satellite valleys as opposed to the centrally-located conduction band minimum) leads to a dramatic reduction of the emission of optical phonons and—according to a conservative estimates—achieves efficiencies of 55% (or even greater) for the photovoltaic device as a result of substantial elimination of most of the optical phonon loss. Notably, as used herein, the term "entire band structure" is defined to encompass the satellite valleys of the conduction band as a metastable level (to prevent, in operation of the resulting photovoltaic device, excessive phonon decay and to achieve extraction of the photo-electrons at higher energy than set by the minimum of the conduction band.)

Figure 1:
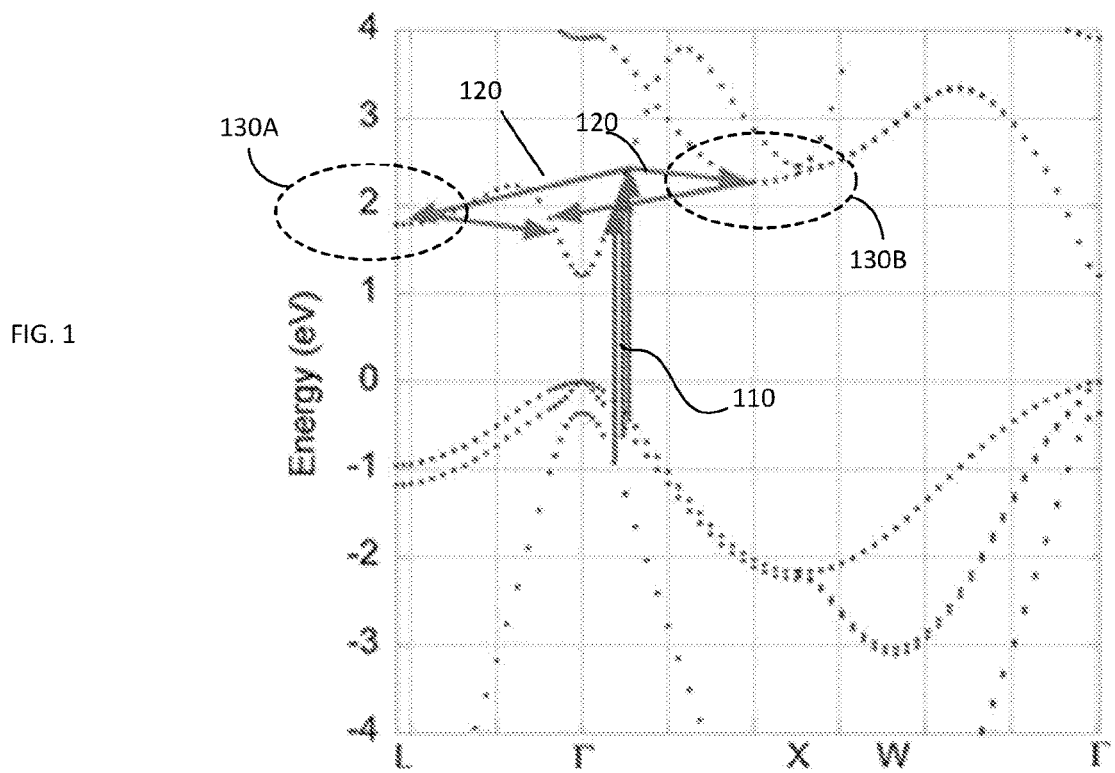
FIG. 1 illustrates a band structure of In0.65Al0.35As. Arrows indicate optical and phonon transitions.

Hot carriers can be created in two distinct manners. Firstly, the hot carriers can be formed by accelerating the carriers in a high electric field. Secondly, they can be created by optical excitation of electron hole pairs, as in, for example, photo-excitation process. In either case, full understanding of the hot carrier response requires the full electronic (and hole) band structure. An example of such a band structure is shown in FIG. 1 for strained InAlAs. In this example, the optical transitions are shown as vertical arrows 110, and the subsequent scattering processes for intervalley transitions are shown as arrows 120. Here, electrons produced above the satellite valleys at L and X (see 130A, 130B in FIG. 1) are transferred first to these valleys. The scattering rate to these valleys is often 10× higher than that of direct polar optical phonon emission in the central valley. Moreover, the time for which the electrons remain in these satellite valleys is extremely long in the InAs-based materials, and can be several picoseconds. This has been demonstrated by sub-picosecond Raman scattering in which the peak in the Raman signal occurs almost 10 ps after the initial pulse. This situation arises as the polar optical phonon cascade from the electrons in the Γ valley does not fully build up until after the carriers return from the satellite valleys, and this requires many fs.

Carriers can be excited into the satellite valleys by an applied electric field (see, for example, Gunn in Solid State Commun. I, 88, 1963) and Ridley et al in Proc. Phys. Soc., 78, 293, 1961) InGaAs, for example, the L valleys lie some 0.3 eV above the main conduction band minimum (at Γ in FIG. 1), but an electric field of as small as 3.5 kV cm$^{-1}$ is sufficient to begin electron transfer to these higher lying valleys. The carriers are accelerated by a high applied field and are transferred to the satellite valleys. At an electric field of 25-30 kV cm$^{-1}$, for example, almost 90% of the carriers are in the satellite valleys. These carriers remain in the satellite valleys until they exit the device at the drain contact, due to their long lifetime.

The idea of the present invention contemplates a solution based on the realization that a hot carrier solar cell that employs the hot carriers that are "parked" in the satellite valleys will possess substantially higher efficiency as compared with those of related art. (This situation will dramatically reduce the emission of optical phonons, relaxation to the band minimum, and re-emission of black-body radiation).

Stated differently, in embodiments of the proposed system, the use is made of electrons in the Γ-valley that are caused to scatter into the higher order L and X-valleys, since this process is of the order of 10 times faster than LO phonon emission. Indeed, here any process of carrier thermalization via LO phonon emission requires intervalley phonons to reemit (or transfer) carriers back to the Γ-valley. Since the densities of states of the L- and X-valleys are much greater than that of the Γ-valley, the emission of intervalley phonons for the transfer of carriers to the upper valleys is much more efficient than the reabsorption of intervalley phonons back to the Γ point. This, therefore supports the long-lived occupation of carriers in the metastable satellite valleys, facilitating hot carrier extraction in a barrier or emitter region of a suitable solar cell system and subsequently increasing the operating voltage or open circuit voltage of the cell while maintaining the levels of extracted photocurrent.

In addition to harnessing hot carriers via direct absorption and scattering by optical excitation (according to the idea of the invention), the proposed device architecture leverages the increased energy and subsequent scattering of lower energy photoelectrons in a high field region around the device junction Specifically, once absorbed in the active region, carriers exposed to the large electric fields in the depletion region gain kinetic energy and subsequently scatter into the upper valleys, thereby enabling the collection of absorbed carriers from a distribution of energies.

With the above preliminary discussion, a person of skill in the art will now appreciate how to formulate requirements to a true HCSC. An implementation of a true HCSC is subject to the following requirements:

(1) The primary absorber material should be a semiconductor with satellite valleys configured to provide a metastable energy level where the hot carriers can be localized free from emission of extraneous optical phonons. Such primary absorber material requires an appropriate band-structure whose transitions are well matched to the solar spectrum and that enable efficient transfer from the gamma valley to the higher order metastable valleys such as to reduce the effects of polar optical phonon emission and subsequent heat generation and loss.

(2) The absorber material layer should preferably be relatively thin (equal to or less than the minority carrier diffusion length of carriers in the relevant absorber material), lightly-doped, and direct. These characteristics facilitate higher optical absorption, and the generation of a high field region within the high absorbing active region. This facilitates the scattering of lower energy photogenerated carriers into the satellite valleys. (In one non-limiting example, the doping level is that characterized by the concentration of dopant(s) on the order of $10^{15} \ldots 10^{16}$ cm$^{-3}$ or less, to cause the depletion layer to be wider than the physical thickness of the absorber layer, while keeping the electric field caused by the built-in potential of the p-n junction high, for example >20 kV/cm), so that the p-n junction induced depletion region punches through this layer to create a Mott-like barrier, in which the electric field remains sufficiently high to accelerate those carriers near the conduction band minimum back to the satellite valleys.) The large mismatch in doping concentration across the absorber/barrier interface also serves to retain a large electric field and scattering to the upper valleys during photovoltaic operation in forward bias.

(3) In one implementation, the presence of a high-energy barrier layer is required to inhibit direct extraction of low-energy carriers (that is, to prevent carriers near the conduction band minimum from contributing to photo-current). Such high-energy barrier layer is configured to have a conduction band energy that is well matched to a satellite valley of equivalent or lighter mass (L to L, L to X, or X to X) in the absorber to enable rapid extraction of hot carriers. (This last requirement may usually be satisfied with the energy-selective contact, configured to allow passage of carriers having energy greater than a minimum energy in the band structure, while preventing carriers near the conduction band minimum from contributing to photo-current, but that requirement can be relaxed, as discussed below).

In the following, the implementation of the idea of the HCSC is illustrated based on a particular set of semiconductor alloys and heterojunctions: these examples are not necessarily described by the optimized structure(s), but are non-limiting examples demonstrating clear improvements over traditional approaches to solar cells.

In most general terms, an embodiment of the p-n junction solar cell is constructed from the growth substrate with a p+ heavily-doped layer followed by an n-layer. The combination of the heavily-doped (>$10^{18}$ or even 1019 cm$^{-3}$) p-layer and the lightly-doped (<$10^{16}$ cm$^{-3}$) n-layer assures that nearly all the depletion width of the junction is located in the n-layer. It is preferred, however, that the n-layer be thinner than the depletion width, so that the electric field extends through this layer to a collector. (It is this punch through of the n-layer that provides the Mott-type device and maintains a high electric field throughout this layer.) From these concerns, this absorber layer is taken, in one specific case, to be 200 nm thick. Additionally, the p-layer and the n-layer are preferably lattice-matched to one another, as the generation of dislocations may become detrimental to the device operation. (If there is strain in either of these layers, their thickness must be kept below the Matthews-Blakslee limit, and this is usually too thin for effective use in solar cells.)

Example 1

Figure 2:
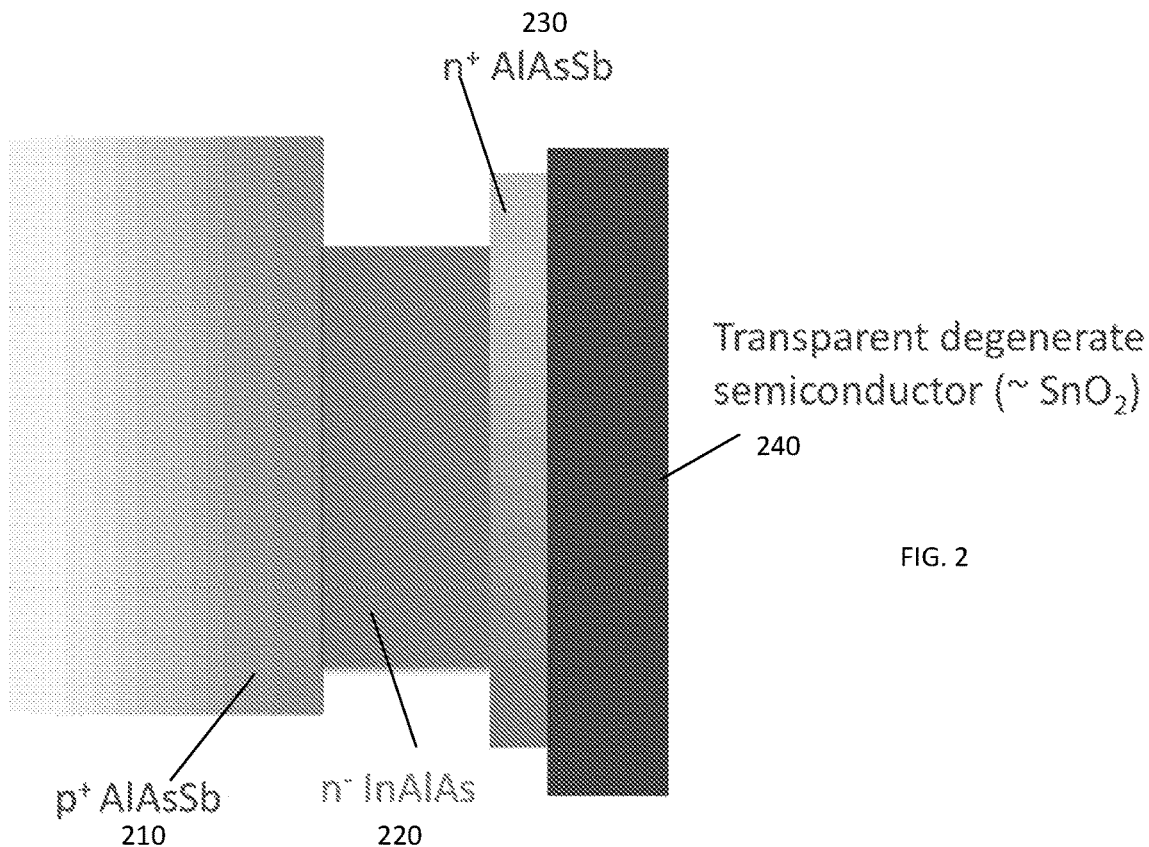
FIG. 2 is a schematic diagram of some of the structural layers of an embodiment of the invention that utilizes InAlAs n-type as an absorber layer.

In reference to FIG. 2, one considered example if a p-n junction solar cell is constructed with the use of an AlAs$_{0.16}$Sb$_{0.84}$ heavily-doped p-type layer 210 and an In$_{0.65}$Al$_{0.35}$As lightly-doped n-type layer 220. (Notably, these materials are traditionally cladding materials for solar cells, and not used normally for construction of an absorber region). The heavy doping (>$10^{18}$ cm$^{-3}$) of the p-doped layer 210 and light n-doping (<$10^{16}$ cm$^{-3}$) of the absorber layer 220 ensure that a substantial portion of the depleted region (~the depletion region or zone associated with the p-n junction) is located on the side of the absorber layer 220, with respect to the junction. (Conventionally, the terms depletion region or layer or zone refer to an insulating region within a conductive, doped semiconductor material where the mobile charge carriers have been diffused away, or have been forced away by a built-in electric potential of the p-n junction.)

Specifically, the layer 220 is configured to avoid or at least reduce the generation of dislocations, which allow the lattice of the material of the layer 220 to relieve the strain that is necessary for operation of the device. The exact material content of the heavily-doped p-type AlAsSb layer 210 is judiciously chosen to have this layer be substantially lattice-matched to InAs, to reduce lattice-mismatch-related strain in the material, which is beneficial during the fabrication of the device. (This is likely to relax as a result of dislocation generation. Hence, it is better to let the InAlAs layer relax, and modify the AlAsSb concentration to match this 0.59 nm lattice constant.)

In this example, the InAlAs absorber layer 220 is n-doped at a low concentration of less than or equal to about $10^{16}$ cm$^{-3}$ is chosen to be about 200 nm thick. It is appreciated, however, that generally the thickness of absorber layer is defined to be between about 180 nm and 220 nm in order to maintain the high electric field.

The thickness of the absorber layer 220 is preferably chosen to be smaller than the width of the depletion region on the side of the junction corresponding to the absorber layer. Alternatively or in addition, the thickness of the absorber layer may be smaller that the diffusion length of the photo-excited carriers.

A thin carrier-collector layer 230 (in one example—up to about 10 nm in thickness) of a doped AlAs$_{0.16}$Sb$_{0.84}$, which is immediately-adjacent to the layer 320, is used for extraction of photo-generated carriers from the satellite valley(s) of the band structure without unnecessary losses of energy, as discussed below, and is a semi-infinite energy collector or semi-infinite energy filtering contact layer.

In this example, the depletion region is estimated to be about 370 nm thick, so the depletion region extends beyond the absorber layer 220 into the heavily-doped contact layer (which, in one case, may be n+ AlAsSb layer 230). The heavy-level of doping of the layer 230 is defined to cause the termination of the electric field of the depletion region at a point where the electric field at the boundary of the absorber layer remains quite high (for example, in excess of 10 kV/cm in one implementation; in excess of 20 kV/cm or even 25 kV/cm or up to 30 kV/cm in a related embodiment).

Figures 6, 7:
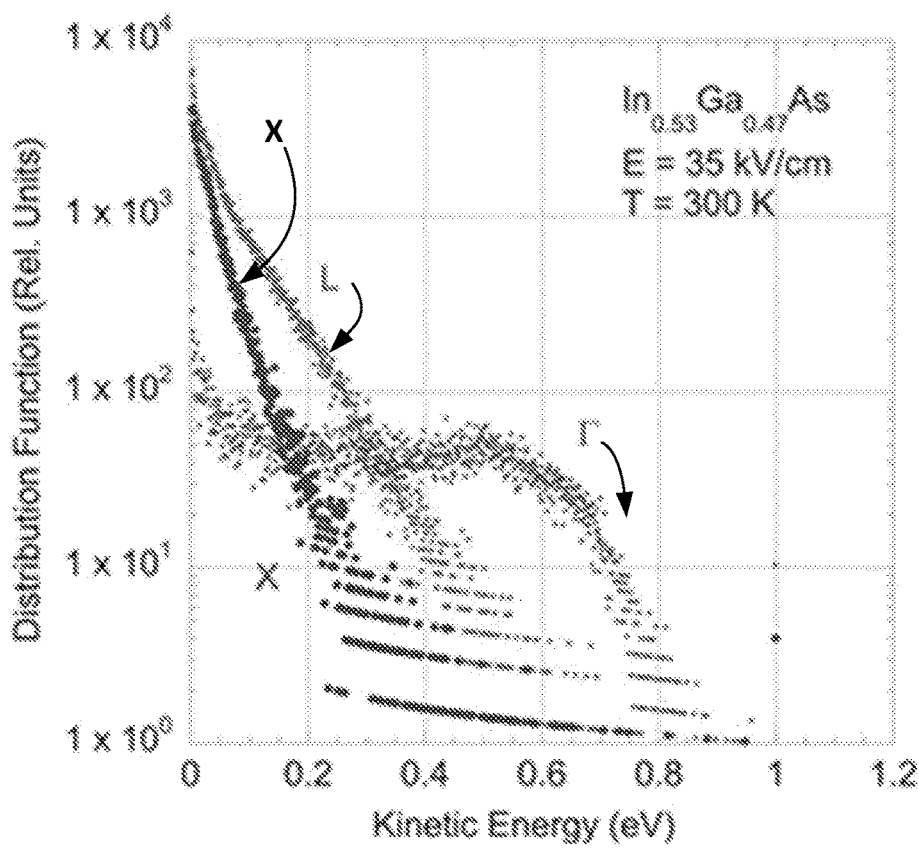
FIG. 6 illustrates distribution functions for the carriers in the three valleys of the conduction band of the embodiment of FIG. 3. The carriers in the $\Gamma$ valley are far from a thermal distribution, due to the streaming to higher energies in the applied field.
FIG. 7 contains Table 1 summarizing itemized material parameters.

The schematic diagram showing a distribution of electric field throughout the stack of layers 210, 220, and 230 of the structure of FIG. 2 is presented in FIG. 6. FIG. 6 schematically illustrates, for the purposes of comparison, plots of spatial distribution of electric field throughout the geometrical structure of Fig. w, in which the solid line corresponds to the distribution formed when the layers 210 and 220 are doped such that the concentrations of respective dopants in these layers are, respectively, first and second concentrations. The portions of the dashed line, however, schematically represent the electric field distribution under the condition that the respective doping concentrations in the layers 210 and 220 are changed: specifically, the doping concentration of the layer 210 is reduced to the third concentration (which is lower than the first concentration), while the doping concentration of the layer 220 is increased to the fourth concentration (which is higher than the second concentration). Understandably, the geometrical extend of the corresponding depletion region is also changed as a result of the change of respective doping concentrations. Different sections of the schematic of the electric field distribution are labelled A, A', B, and B'.

(With the discussed specific implementation of the structure, the lightly-doped n-type layer 220 of In$_{0.65}$Al$_{0.35}$As is configured to be the primary absorption layer in the device.)

The heavily doped contact layer 240 (such as a degenerate optically-transparent semiconductor layer, optionally structured around SnO$_2$) is then grown on the outer surface of the layer 230 to both terminate the depletion layer of the p-n junction and to efficiently extract the carriers from the satellite valley(s) of the band structure of the absorbing layer material used in the device. According to the idea of the invention, the depletion region is not extending into the contact layer.

Using the empirical pseudo-potential modelling discussed by Ferry D K in 2019 Semicond. Sci. Technol. Vol. 34, 044001, 2019), a person of skill will readily determine that the direct band gap of In$_{0.65}$Al$_{0.35}$As is 1.2 eV and that the L valleys lie some 590 meV higher than that level, while the X valleys are 0.67 eV higher. Hence, the L valleys can serve as and are the primary source of the metastable satellite levels for the HCSC. These bands create the absorber energy levels necessary for the solar cell.

Example 2

Figure 3:
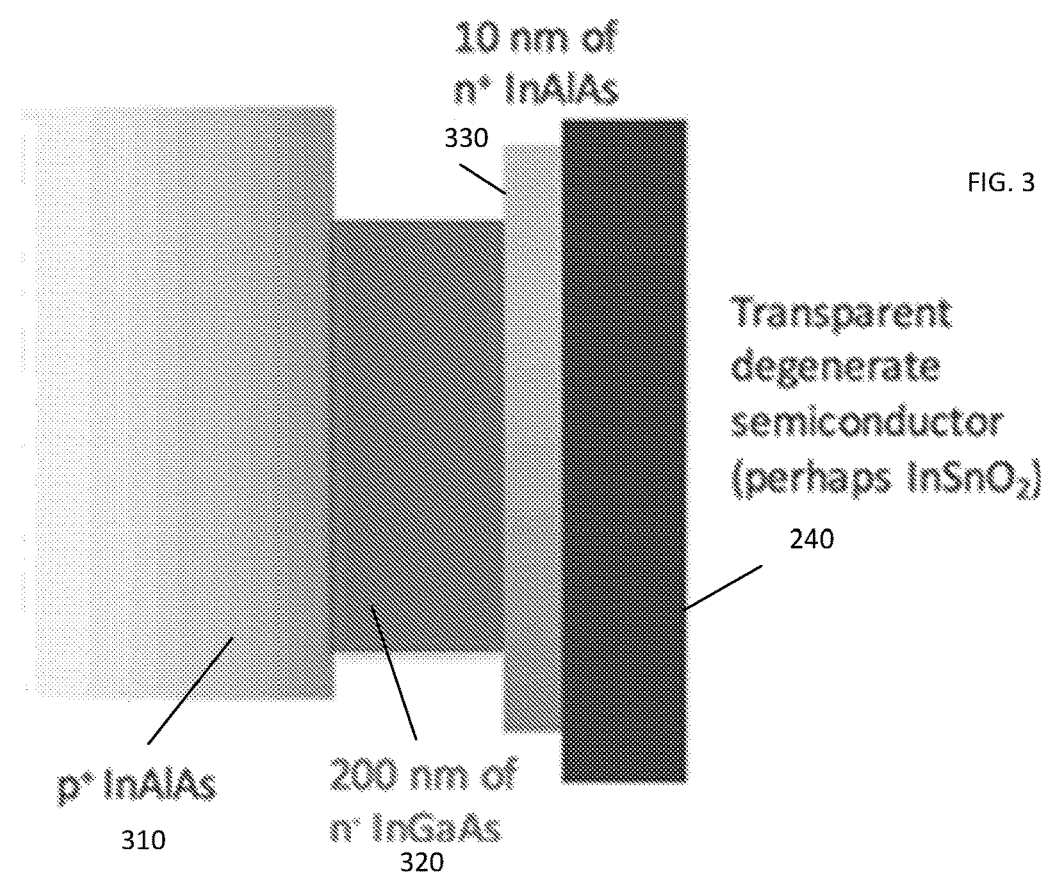
FIG. 3 is a diagram illustrating conceptual band lineup for the proposed solar cell using an InGaAs n-type absorber layer.

In reference to FIG. 3, the second material system is growth on an InP substrate (not shown) with a heavily-doped In$_{0.52}$Al$_{0.48}$As p-layer 310 followed by a lightly-doped In$_{0.53}$Ga$_{0.47}$As n-layer 320 (as shown, the absorber layer having a thickness of about 200 nm. In related embodiments, the thickness of absorber layer is defined to be between about 180 nm and 220 nm in order to maintain the high electric field.) While this latter material has a smaller band gap of about 0.75 eV, the positon of the L minimum lies about 0.5 eV above the conduction band, and at a level at the peak of the Shockley-Quiesser efficiency curve. This second material combination is an alternative to that discussed in Example 1, and is believed to be a potentially better candidate to produce good results for this new proposed type of cell. These materials have poor degeneracy in the valleys. Accordingly, the discussion below will use this particular system as an example. The conduction band offset at the interface between the $In_{0.53}$ $Ga_{0.47}As$ n-type layer 320 and the $In_{0.52}Al_{0.48}As$ p-type layer 310 is taken to be 0.53 eV, although it may be likely slightly more for the p-type layer.

Here, an alternative layer of $Al_{0.7}In_{0.3}As$ (rather than $In_{0.52}Al_{0.48}As$) might be incorporated. These systems comprise DX centers, which can serve to better match the valley degeneracy required at the interface (for example, J. Appl. Phys. 85, 3380, 1999). That is, to support a resonance between the carriers in the metastable L and/or X-valley of the absorber, and a lighter defect driven valley (Γ/L)-valley in the selective extraction layer, to provide a better solar cell.

A simulation of the energy bands for the complete cell has been carried out with the specifically-developed software package and has shown that the electric field in the $In_{0.53}$ $Ga_{0.47}As$ layer is approximately 35 kV $cm^{-1}$. This should be adequate to excite carriers collected in the F minimum up to the L minima with reasonably good efficiency: 80%-90% of the photo-excited carriers are expected to be in the L and X valleys of the conduction band.

While Ross and Nozik (1982 J. Appl. Phys. 53 3813) proposed the use of an energy-selective filter for extraction of the carriers from the L valleys (to bring out only a portion of the carriers), their proposal was shown to yield very low efficiencies (see Kirk A P and Fischetti M V 2012 Phys. Rev. B, 86, 165206, 2012). We discovered that it is possible to avoid resorting to the use of a narrow-band filter, and only to block the electrons from near the bottom of the Γ valley. For this purpose, a thin layer 310 (about 10 nm thick) of heavily-doped n-type $In_{0.52}Al_{0.48}As$ is used, as shown in FIG. 3. These materials have a band gap that aligns so that the bottom of the conduction band is located almost exactly at the L level of the absorber material of the layer 320. The barrier layer 330 is doped so that the quasi-Fermi level of the L level aligns closely to that of the collector layer to minimize band bending. This very heavily-doped collector layer serves to both terminate the depletion layer of the p-n junction and to efficiently extract the carriers from the device.

There exist constraints on the subsequent contact layer: It should have an electron affinity that is close to that of the collection layer in order to avoid additional losses in the contact. One possibility is to use an optically transparent degenerate semiconductor such as $InSnO_2$ or $SnO_2$, e.g. although this may not have the proper electron affinity. In practical implementation of an embodiment, the contact material should be carefully chosen to avoid extra losses in the contacts.

Material Analysis

Figure 4:
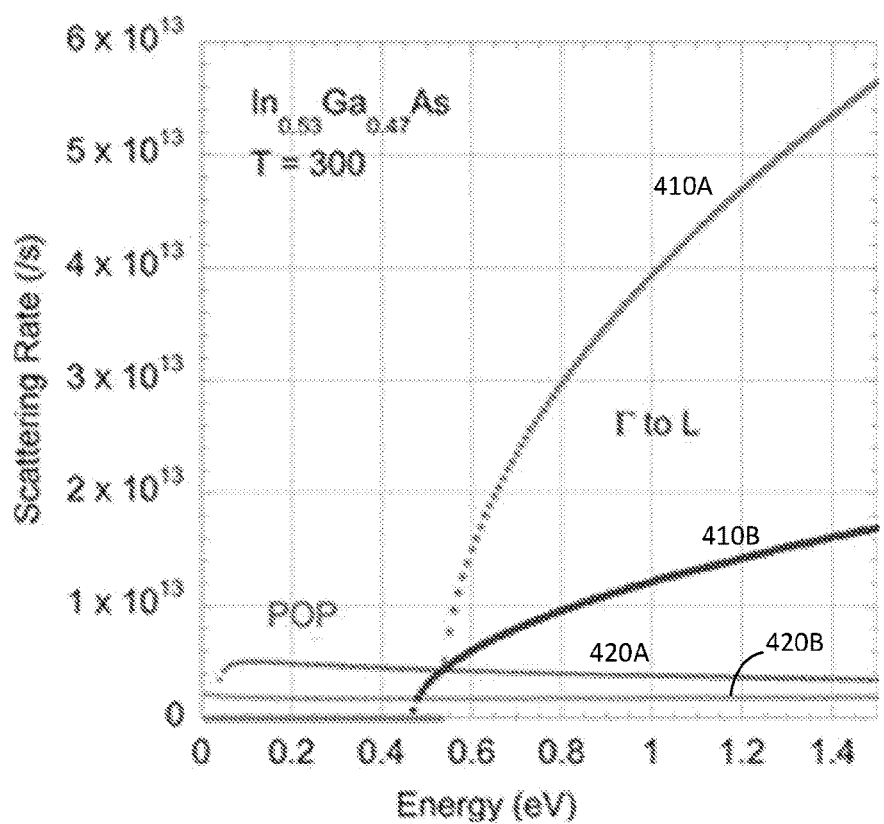
FIG. 4 illustrates scattering rates for the electrons in the $\Gamma$ valley for the polar optical and intervalley processes as a function of the carrier energy (for the embodiment of FIG. 3). The upper curve for each pair is for the emission of phonons.

In order to carry out the study of the prospects for such a hot carrier solar cell, we have studied the transport in the absorber InGaAs layer 320 of the structure of FIG. 3 (Example 2). The transport is simulated using an ensemble Monte Carlo technique similar to that discussed by Kirk and Fischetti, for example. Here, the material is assumed to be doped to $<10^{16}$ $cm^{-3}$. Scattering may be caused by impurities, acoustic phonons, random alloy potential, polar optical phonons and the full slate of intervalley phonons between the Γ, L, and X valleys. FIG. 4 presents plots with the scattering rates for the polar optical phonons and the Γ→L scattering process for both absorption (curves 410B, 420B) and emission (410A, 420A) of the relevant phonons. It is clear that the scattering rate for transfer to the L valleys is more than an order of magnitude larger than that for the polar modes.

Figure 5A:
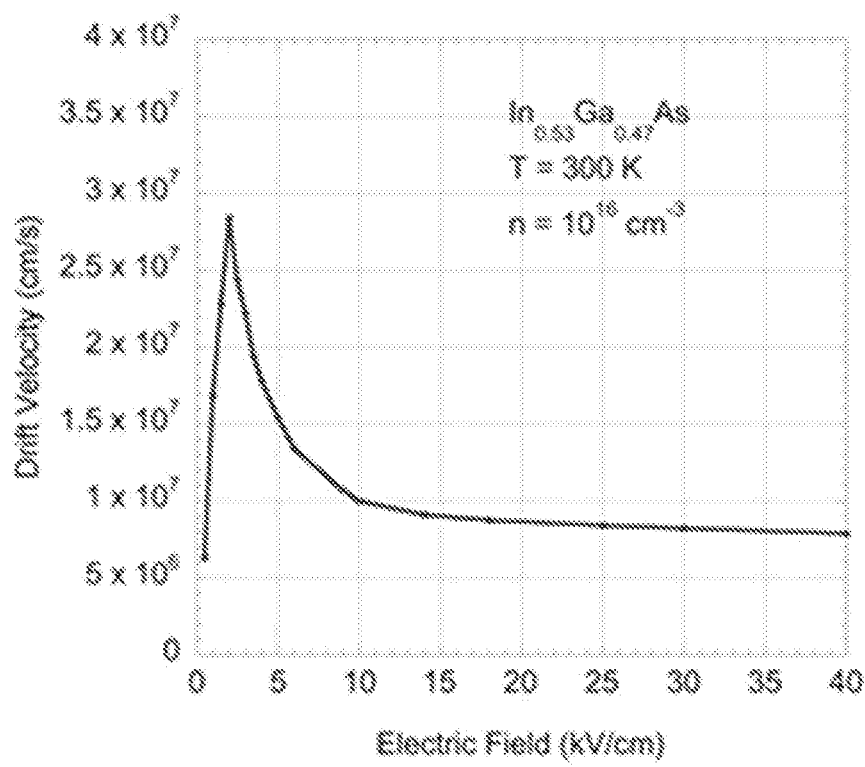
FIG. 5A: The velocity-field curve for the InGaAs layer 320 of the embodiment of FIG. 3.
Figure 5B:
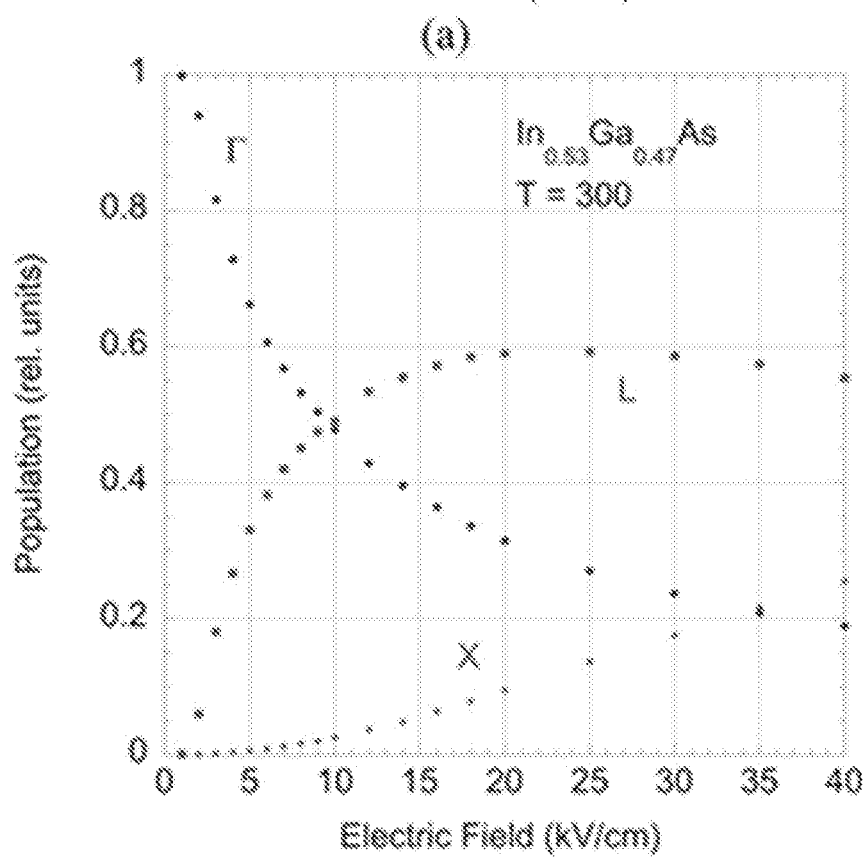
FIG. 5B: Relative population of valleys in In0.53 Ga0.47As as a function of electric field, calculated using Monte Carlo simulations that consider impurities, optical and acoustic phonons, and the full slate of intervalley phonons for the embodiment of FIG. 3.

FIG. 5A illustrates the velocity-field characteristic for $In_{0.53}$ $Ga_{0.47}As$ at 300 K. The peak velocity occurs near 2 kV $cm^{-1}$ and the low field velocity is on the order of 14 000, comparable to what has been measured experimentally for this doping level. FIG. 5B presents plots of the relative populations of each of the valleys as a function of the electric field. (This is done for an initial carrier distribution at 300 K, with all carriers in the Γ valley.)

A mentioned above, the electric field in the InGaAs layer 320 is approximately 35 kV $cm^{-1}$. At this field, we can estimate the effective temperatures for the carriers in each of these valleys. The distribution functions for the three valleys are shown in FIG. 6. The first thing one notices is that the carriers in the Γ valley do not have a well-defined temperature as the distribution is very non-thermal. Hence, the assumption that the carriers rapidly thermalize to the bottom of the conduction band where they can recombine is just not the case in this high electric field. The streaming of the carriers to higher energy means that it is much less likely that significant direct recombination will occur in the cell. It is important to note that the streaming apparent in FIG. 6, for the carriers in the Γ valley has been measured some years ago for several semiconductors using picosecond Raman back-scattering from the free carriers although not specifically for $In_{0.53}$ $Ga_{0.47}As$. Nevertheless, it is considered to be generic behavior. In contrast to the Γ valley, the distribution functions for the carriers in the upper valleys can be characterized approximately by a temperature, and this leads to values of $T_L$~1150 K and $T_X$~450 K. These tend to be lower than people have previously estimated, and this will lower the probability of recombination from these upper valleys, especially as this is a second-order indirect process.

Further steps of the analysis are taken the assumption that the initial distribution is characteristic of the solar excitation temperature, ~5400 K. (It turns out that these curves are very close to those of FIG. 5B, so these will not be repeated.) With this distribution, we can then follow the temporal evolution of the valley populations to determine the characteristic time constants which are estimated by the appropriate linear response approximation. These values are then used to extrapolate to the populations expected for steady solar illumination. This suggests that the relative fractions of the steady-state population, at 35 kV $cm^{-1}$, in the three valleys are given as: $n_\Gamma$~0.15, $n_L$~0.6, $n_X$~0.25. This result supports the above-stated assessment that most of the carriers can be maintained (kept) in the metastable upper valleys of the conduction band, thus supporting the concept of a hot carrier solar cell. The term "maintain" or "keep" is defined here to mean that the carriers will actually leave through the extraction layer rather than relax back to the Γ minimum.

Analysis of the Cell

In general, the analysis of embodiments of solar cells depends upon the light falling upon the cell, from the Sun, and an estimate of the internal losses. The following analysis is performed based on the approach presented by, for example, Würfel et al (2005, Prog. Photovolt., Res. Appl. 13 277). The carrier generation process is usually described in terms of the particle flux absorption for a flat plate cell (without concentration)

$$J_{abs} = \frac{2\Omega_{abs}}{h^3 c^3} \int_{\varepsilon_G}^{\infty} \frac{\varepsilon^2 d\varepsilon}{\exp(\varepsilon/k_B T_S)} \quad (1)$$

where Ts~5400 K is the solar radiative temperature, $\Omega_{abs}$~6.8×10-5 is the solid angle from which the Sun is seen, h and c are Planck's constant and the speed of light, while $\varepsilon G$ is the energy gap of the material. The values for this quantity, and others, for our two material choices are given in FIG. 7.

The photo-generated electrons, that enter with energies above the satellite valleys, will relax into these satellite valleys, where we estimate that 80%-90% will remain. The high electric field will encourage those who relax to the $\Gamma$ valley to return to the satellite valleys in the high applied electric field. Studies of the transport in materials such as this suggest that the hot carriers will move in the high field, in the satellite valleys, with an effective drift velocity of the order of 107 cm s−1, which means that the typical cater will exit the absorber layer within 2 ps. This means that the photo-generated electron concentration will be $$\Delta n = J_{abs} \tau / d \quad (2)$$

where i is the escape time and d is the thickness of the layer (200 nm). This leads to an excess density, in the depleted absorber layer, as given in the table. The estimate is that 80%-90% of these will be in the L (satellite) valleys and 10%-15% in the central $\Gamma$ valley. We estimate that the carriers in the satellite valley have an average temperature determined from the distribution function, as in FIG. 5. The $\Gamma$ valley very non-thermal, but we can determine the 'average' kinetic energy from the simulations, and use this to define a representative temperature for the carriers in these valley. We use this in the table. We do not know how the holes will respond, but this is inferred from photo-luminescence data. These holes will be in the p-layer, not the n-layer, and are given the values shown in the table. From this and the effective masses (density of states), we can estimate that the quasi-Fermi level for the satellite valley electrons lie of the order of 1 eV below the satellite valley energy. Similarly, this same argument suggests that the quasi-Fermi level for the electrons in $\Gamma$ roughly 1 eV below the conduction band minimum and that for holes lies some 0.3 eV above the valence band maxima of the p-type layers. These are extreme values arising from the relatively small carrier densities involved and the depleted nature of the absorber layer. The carriers in these valleys can, of course, be depleted by radiative recombination. The particle fluxes for this are expressed as $$J_{em} = \frac{2\Omega_{abs}}{h^3 c^3} \int_{\varepsilon_G+L}^{\infty} \frac{\varepsilon^2 d\varepsilon}{\exp(K/k_B T_L)} \quad (2a)$$

$$J_{em} = \frac{2\Omega_{abs}}{h^3 c^3} \int_{\varepsilon_G}^{\infty} \frac{\varepsilon^2 d\varepsilon}{\exp(K/k_B T_L)} \quad (2b)$$

wherein the two quantities K are given by $$K_i = (\varepsilon_{ei} - \mu_{ei}) - \frac{T_{ei}}{T_h}(\varepsilon_h - \mu_h) \quad (3)$$

and i=$\Gamma$, L. Because of the enormous values of the quasi-Fermi levels, these radiative recombination fluxes are found to be orders of magnitude smaller than the absorption values and are basically irrelevant.

An additional quantity necessary to evaluate the HCSC is the energy that is brought to the cell. We determine this by adding an additional factor of $\varepsilon$ to the integral (1), which adds an additional factor of 3.25×10-19 to the photon flux given above. The resulting quantity is called Usun. Then, the cell's efficiency is $$\eta = \frac{e}{U_{abs}}(J_{abs} - J_{em,L} - J_{em,\Gamma})(V_e - V_h) \quad (4)$$

The two voltages are given by $$V_i = E_i - (E_i - \mu_i)\frac{T_0}{T_i} \quad (5)$$

The two emission values shown in the table are negligible in comparison to the absorption, and the voltages are determined using the L valley for the electrons and the holes in the p-layer. This leads to the values given in FIG. 7. The results for either of these materials choices gives prospective efficiencies well above those of other single junction solar cells.

It is appreciated, therefore, that an embodiment of the true hot carrier solar cells can be created by utilizing the higher lying satellite valleys of the conduction band. The proposed approach is rooted in encouraging the photo-electrons to transfer to the satellite valleys to prevent the loss of energy through emission of optical phonons, thereby keeping the photo-excited carriers at higher energies in the conduction band. The presented Examples proposed materials systems, in which such process will naturally occur, along with the use of the built-in electric field of the junction to reaccelerate carriers from the conduction band minimum to the satellite valleys. In addition, we suggested the use of a semi-infinite (in energy) collector layer by which all carriers above the CBM minimum can be collected in a manner that rejects those carriers at low energy in the $\Gamma$ valley of the absorber layer. But, there are further considerations on these collector materials. With the In0.52Al0.48As collector, the conduction band minimum is near the L valley of the In0.53Ga0.47As, as it is a direct gap material. Hence, the hot carriers in the L valley may have trouble leaving via the L valley as it requires an inter-valley phonon in moving from the absorber layer to the collector layer. And, the L valleys in the collector layers are considerably higher in energy. This creates a barrier to the L-L spatial transition, which may hinder the collection of the photo-electrons.

It is also important to note that when the photo-electrons transition from the absorber layer to the collector layer, a very large fraction of their kinetic energy is converted into potential energy of the band offset arising from the larger bandgap of the collector layer. The greatly reduced kinetic energy in this latter layer cannot emit large numbers of LO phonons and this further prevents significant energy loss by this mechanism. Now, the problem is shifted to the metal contacts, where a choice must be made to find a metal with the appropriate work function to minimize more energy loss by the carriers through relaxation in the contact.

While the cell design may not be optimal, the simple theoretical efficiencies found in the analysis are suggestive of much better performance than is found in the single junction solar cells of related art. While the discussion above was presented with the use of In0.53 Ga0.47As/In0.52Al0.48As cell (as it seems to be the more realistic of the two possible cells suggested), alternative structures satisfying the above-discussed requirements are within the scope of the invention.

From the above-discussed examples it is appreciated, therefore, that embodiments of the invention provide a photovoltaic device the structure of which includes first and second layers to form a p-n junction that is configured such that substantially all of a depletion region associated with the p-n junction is located on a first side of the p-n junction. Moreover, the large doping concentration difference at the interface(s) facilitates the retention of a high-field region of the order of 20 nm-50 nm in geometrical extent at the boundary of the absorber and higher energy extraction/barrier layers, standard under operating conditions. This enables scattering of low energy carriers and retention of the operating voltage at resonance with the high energy valleys under photovoltaic operation. The device has an absorbing layer (interchangeably referred to herein as absorber layer) configured to congregate a substantial majority of photo-generated carriers at a first meta-stable energy level (of the energy bands of the structure of the device) in operation of the device. The first meta-stable energy level is defined to be higher than an energy level of a bottom of direct-gap conduction band of the material of the absorbing layer. Furthermore, the absorbing layer is under material strain defined to substantially match a lattice constant of such absorbing layer to a lattice constant of another of the first and second layers. The absorbing layer has a first thickness that is smaller than any of first and second thickness values (the second thickness value is the thickness of the depletion region, and the third thickness value is chosen to be sufficient for substantial relaxation of strain to a level below 3%, preferably below 2%, more preferably below 1%, and most preferably below 0.1%).

It is also appreciated that in a specific case, the embodiment of the proposed photovoltaic device additionally includes a carrier-extraction layer adjoining the absorber layer, where the carrier-extraction layer has a corresponding band gap defining i) a valence band that lies below a valence band of the absorbing layer, and ii) a conduction band at an energy level substantially equal to the first meta-stable energy level. Here, the carrier-extraction layer is configured as a semi-infinite energy collector. The embodiment of the photovoltaic device may optionally include an auxiliary layer between the carrier-extraction layer and the absorber layer, and/or have a doping type of the carrier-extraction layer be the same as a doping type of the absorbing layer. In substantially any of the above-identified embodiments, the photovoltaic device may be configured to satisfy at least one of the following conditions: a) a thickness of the carrier-extraction layer is smaller than a thickness of the absorbing layer; b) the thickness of the carrier extraction layer is about 10 nm; and c) the thickness of the absorbing layer is about 200 nm. In substantially any of the above-identified embodiments, the photovoltaic device may be configured such that electric field (caused by a built-in electric potential of the p-n junction at an interface between the absorption layer and the carrier-extraction layer substantially exceeds 10 kV/cm). Substantially any of the above-identified embodiments mat include a contact layer of degenerate semiconductor material that is sandwiched between the absorbing layer and the layer of degenerate semiconductor material. (In this latter case, the contact layer is configured to terminate the depletion region.)

In substantially any of the above-identified implementations, the photovoltaic a first concentration of dopants in the absorber layer is defined to not be substantially higher than about $10^{16}$ cm$^{-3}$, and a second concentration of dopants in the carrier extraction layer is not substantially lower than about $10^{18}$ cm$^{-3}$.

Example 3: Initial Study of the Device Architecture Based Upon the In0.47 Ga0.53As/In0.52Al0.48As System Lattice-Matched to InP Substrates and Grown by Molecular Beam Epitaxy Driven by the above-discussed considerations, and in particular as discussed above in reference to FIG. 3, an embodiment of the layered semiconductor structure was implemented. Specifically, a heavily doped p-type In0.52Al0.48As layer was deposited upon a p-type InP substrate and followed by a lightly-doped n-type In0.47 Ga0.53As absorber. The structure was completed with a thin, highly doped n-type In0.52Al0.48As upper emitter/barrier. The band gap of the InGaAs absorber is ~0.75 eV and the L-valley lies some 0.5 eV above the conduction band minima.

Notably, generally, the methodology of fabricating of substantially any embodiment photovoltaic device disclosed herein (such as the HCSC configured according to an embodiment of the invention) includes a step of forming a stack of layers that include a first heavily-doped semiconductor layer and a strained second lightly-doped semiconductor layer to form an interface between these layers and a p-n junction. Here, a type of doping of the first layer is different from a type of doping of the second layer. The methodology further includes a step of growing a third heavily-doped layer to be carried by the stack (where the third layer being doped with a type of doping that is the same as the type of doping of the second layer) to form a depletion region that is thicker than the second layer. Here, such growing results in a majority of the depletion region being located in the second layer; and a thickness of the second layer is smaller than a thickness at which a strain of the second layer is reduced below approximately 0.1%. In one case, the growing step of the embodiment of the method may include growing the third layer under conditions that cause a quasi-Fermi level of the L satellite valley of a band structure of the second layer to substantially align with a quasi-Fermi level of the third layer. Alternatively or in addition—and in any of the above implementations of the method, the steps of forming and growing may be accomplished under conditions that result in electric field (formed by a built-in potential of the p-n junction at an interface between the second and third layers) to exceed 10 kV/cm. Alternatively or in addition—and in any of the above-identified implementations of the method—the steps of forming and growing may be configured such as to result in the second layer having a thickness that is at least an order of magnitude larger than a thickness of the third layer.

Figure 8:
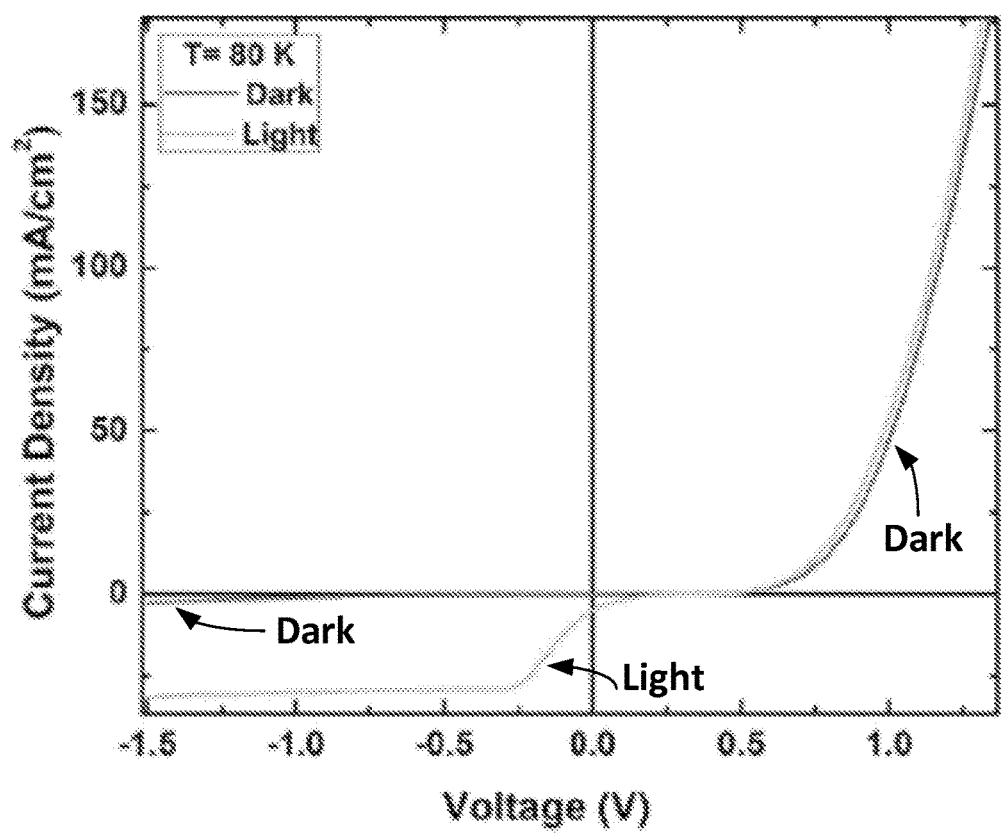
FIG. 8 presents current-density versus voltage for an InGaAs/InAlAs device in the dark and under 1-sun AM 1.5 G at 80 K.

FIG. 8 illustrates the current density-voltage (J-V) response of a 5 mm$^2$ mesa diode at 80 K in the dark (red) and illuminated at 1-sun (green). Although in practice measurements were taken at a number of temperatures, the results of FIG. 8 focus on the low temperature regime, where the effect of thermionic emission is low and carriers can only escape the InGaAs absorber via tunneling and/or scattering processes. The J-V shows a strong inflection in the PV quadrant of the response, which is evidence of inhibited minority carrier extraction and strong carrier localization at Jsc. The cause of this inflection relates to the non-ideal transfer of carriers from the L valleys in the InGaAs to the InAlAs barrier rather than inhibited intervalley scattering within the InGaAs upon absorption.

More specifically, in this system the L valley in the InGaAs layer 320 is aligned to the Γ valley (rather than the more preferred L-valley) of the InAlAs emitter layer 310 (which has a lower density of states and therefore results in a potential barrier to carrier transfer, in this case). However, with increasing reverse bias the carriers that have been absorbed and transferred to higher valleys in the InGaAs layer 320 are collected via tunneling. Complete carrier extraction occurs around −0.3 V with a current density of ~29 mA/cm². This suggests that, despite the presence of inhibited carrier transfer from the absorber into the barriers due to non-ideal valley transfer out of the absorber, significant carrier scattering is occurring within the InGaAs absorber itself, this is attributed to intervalley scattering and the more efficient collection of hot carriers in this system.

The above assessment is evidenced by both the open circuit voltage of ~0.81 V, which is consistent with the full energy gap of the InGaAs, and the large currents extracted in reverse bias. Indeed, although such assessment must be viewed with care, if a conservative fill factor of, for example, 80% is considered for the data shown at 1-sun in FIG. 8, such system would be characterized by a power conversion efficiency of approximately 20%. This value is very close to the Shockley-Queisser limit for the band gap of the InGaAs assessed (23% at 0.75 eV) despite any optimization of the device structure and the absence of any AR coating.

Figure 9A:
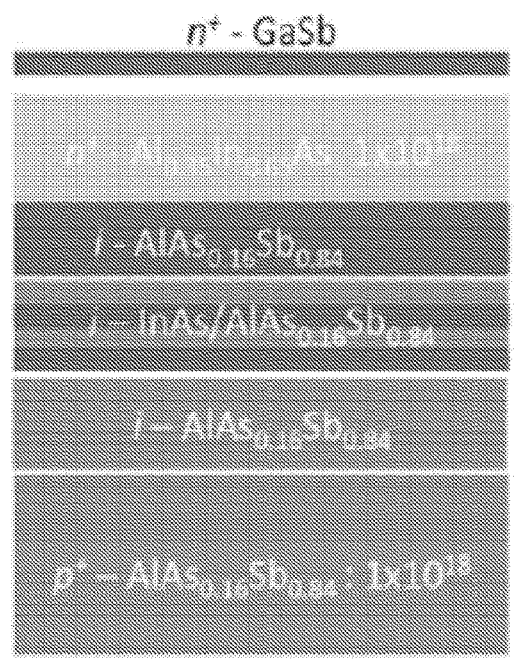
FIG. 9A presents a schematic of p-AlAsSb/InAs QW/n-AlInAs device.

Example 4: The Role of Intervalley Phonons in Hot-Carrier Transfer and Extraction in Type-II InAs/AlASCb Quantum-Well Solar Cells The (InAs/AlAs0:16Sb0:84 type-II QW)-devices under investigation were fabricated from a p-AlAsSb/i-InAs/Al-AsSb MQW/n-AlInAs structure grown by molecular beam epitaxy (MBE) on a p-GaAs (001) substrate. A schematic of this structure is shown in FIG. 9A. The intrinsic region included ten 2.1 nm InAs QWs separated by 5 nm AlAsSb barriers sandwiched in between i-layers of AlAsSb. Prior to the growth of the active structure, the GaAs substrate temperature was increased to 580° C. to remove the native oxide. The substrate temperature was then lowered to 520° C. and a 2 μm thick p+-AlAsSb layer was grown to act as the p-type layer of the heterostructure and to relax the strain induced by the lattice mismatch at the GaAs/AlAsSb interface; thus, ensuring a nearly fully relaxed lattice-matched template for the rest of the structure.

In advance of the deposition of the MQW intrinsic region, a 50 nm AlAsSb intrinsic layer was grown at 520° C. to prevent unintentional p-doping of the active region. The InAs MQW region was then grown at 470° C.: a compromise between the optimum growth temperature of the InAs QWs and AlAsSb barriers. After growth of the MQWs, a 50 nm upper i-AlAsSb layer was deposited followed by a 50 nm n-Al$_{0.35}$In$_{0.65}$As layer grown at 500° C. to complete the p-i-n diode. The structure was completed with the deposition of a 5 nm n+-GaSb cap layer to prevent unintentional oxidation of the upper Al-containing layer.

The layer structures were processed into 6.25 mm² mesa diodes using conventional wet-etching and optical lithography processing with thermally deposited In/Au and Ni/AuGe electrodes used as the upper n-type finger and p-type planar back contacts, respectively. The devices were assessed using simultaneous continuous wave (CW) photoluminescence and monochromatic current density-voltage (J-V) measurements either with an excitation wavelength of 442 nm using a Kimmon HeCd laser system and detection using a LN$_2$-cooled InGaAs linear array via a 2500i Princeton spectrometer. Variable temperature measurements were performed in a Janis closed-cycle cryostat between 4.2 K and 300 K. Temperature dependent J-V measurements were performed between 77 K and ambient temperature at AM1.5 G using a Newport class ABA solar simulator and a Linkam LN$_2$-cooled cryostat.

Figure 9B:
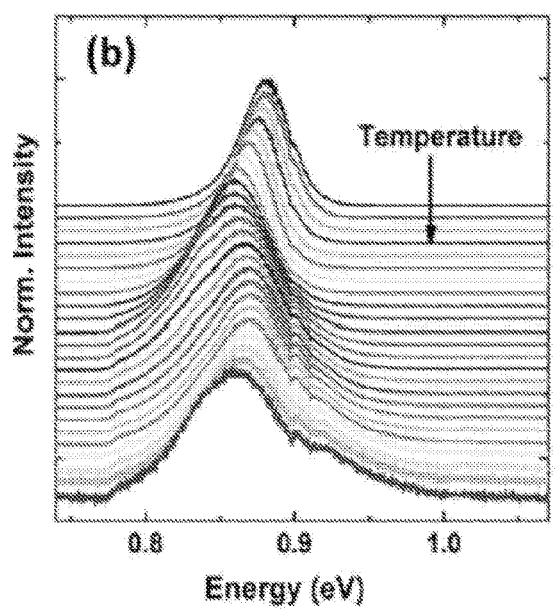
FIG. 9B shows normalized temperature dependent photoluminescence.
Figure 9C:
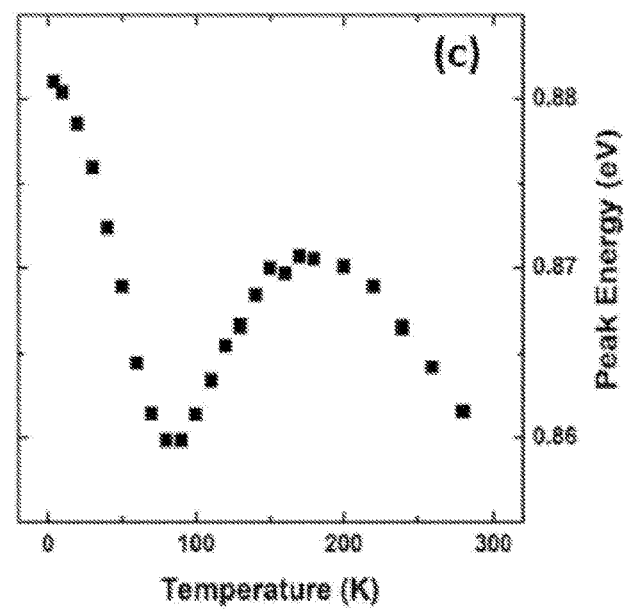
FIG. 9C illustrates the peak photoluminescent (PL) energy of the device configured according to the embodiment of FIG. 9A.

FIG. 9B shows a waterfall plot of the normalized temperature dependent photoluminescence (PL) from excitation at 442 nm. With increasing temperature, a significant 's-shape' is observed which is evident in the peak PL versus temperature response as shown in FIG. 9C. This large localization potential has been observed across several samples in this system and discussed comprehensively elsewhere. However, in the interest of clarity this effect has been attributed to alloy fluctuations and localization of photogenerated carriers at the InAs/AlAsSb interface, which redistribute at higher temperature as described by a number of groups in the literature. The maximum localization potential here is evident at ~90 K. Its depth can be reduced due to the localized states becoming either occupied by photogenerated carriers as the power is increased, or ionized as the temperature is increased. Although this effect does not alter the absorption or emissivity of the QWs, it does inhibit analysis of the PL; therefore, care must be taken in assessing hot carriers using the generalized Planck's equation, which is discussed further below.

FIGS. 10A and 10C the power-dependent results of the PL measurements of the active region of the p-i-n diode at 4.2 K and 200 K, respectively. (These temperatures are chosen such that the effect of carrier redistribution between 10 K and 175 K, see FIG. 9C, is minimized and that the photoluminescence reflects a band gap associated with the ground state transition of the InAs QWs.) Notably, although thermal effects tend to broaden the PL at 200 K (as compared to that at 4.2 K), no visible shift is evident in the peak PL energy; this observation confirms that the emission at the two chosen temperatures predominantly reflects free excitonic and radiative recombination from the ground state of the QWs, rather than localized states at powers in excess of ~80 W/cm².

FIG. 10B includes plots representing the peak PL energy as a function of power at 80 K, and illustrates the effect of the localized states at this temperature (which is close to the maximum localization energy/temperature). It can be observed that, as the power is increased, a large blueshift in the PL energy is evident up to around 50 W/cm². Thereafter, the change in PL slows down, although a smaller increase in energy remains up to maximum power. The lower power regime (P<50 W/cm²) is related to the occupation and eventual saturation of localized/interface states by photogenerated carriers. When power is increased above 50 W/cm², the slope predominantly represents the effect of the type-II band gap and the $P^{1/3}$ dependence expected in such systems due to Coulombic effects (triangular well formation) of electrons and holes at the QW interface. The non-ideal nature of this effect at T=80 K and the subtle (continued) contribution of alloy fluctuations is also evident in the inset in FIG. 10B, which shows the non-perfectly-linear dependence of peak energy versus on $P^{1/3}$.

Analysis of the presence of hot carriers ($T_C$) in this system was performed by fitting the power-dependent PL at 4.2 K and 200 K using a generalized Planck's Law:

$$I_{PL}(\hbar\omega) = \frac{A(\hbar\omega)((\hbar\omega))^2}{4\pi^2\hbar^3 c^2}\left(\exp\left(\frac{(\hbar\omega - \Delta\mu)}{k_B T_c}\right) - 1\right)^{-1}$$

where, $I_{PL}$(ho) is the PL intensity, ho is the emitted photon energy, A(hω) is the absorptivity, Δμ is the chemical potential difference or quasi-Fermi-level separation (holes and electrons) under laser excitation, and $T_C$ represents the non-equilibrium hot carrier temperature. In the simplest case, taking a linear fit to the high-energy tail of the natural logarithm of a PL spectrum determines the carrier temperature.

In order to limit the change in PL emission energy due to carrier localization and redistribution (particularly at lower temperatures, see FIGS. 9B, 9C, 10A), the extraction of the hot carrier temperature from the PL was limited to powers above 80 W/cm$^2$—where saturation of these states was almost complete (see FIG. 10B). Examples of these fits (dashed lines displaced for clarity) are shown for the highest power PL in FIGS. 10A, 10C. The extracted values of the hot carrier temperature difference $\Delta T_C$, defined as the difference between the carrier temperature $T_C$ and the temperature of the lattice $T_L$) are shown in FIG. 10D as solid squares (for 4.2 K) and solid circles (for 200 K), respectively. As the lattice temperature is increased, the $\Delta T_C$ also increases from 75 K at 4.2 K, to about 100 K at 200 K.

These increases and the presence of non-equilibrium carriers in the system occur even at the lowest assessed excitation power density (about 80 W/cm$^2$); they are—in all cases—essentially independent of power. This effect has been observed in several studied InAs/AlAsSb samples and remains a physical property of this system, which is a very encouraging implication for the realization of practical hot carrier solar cells at reasonably low solar intensities. Until now, the related art did not present any explanation of the origin of the power independence, that was not well understood, and so far discussed in terms of the interaction of enhanced carrier lifetimes in type-II QWs, the presence of an acoustic phonon bottleneck, and the thermal mismatch at the InAs/AlAsSb interface.

Figures 11A, 11B, 11C, 11D, 11E, 11F:
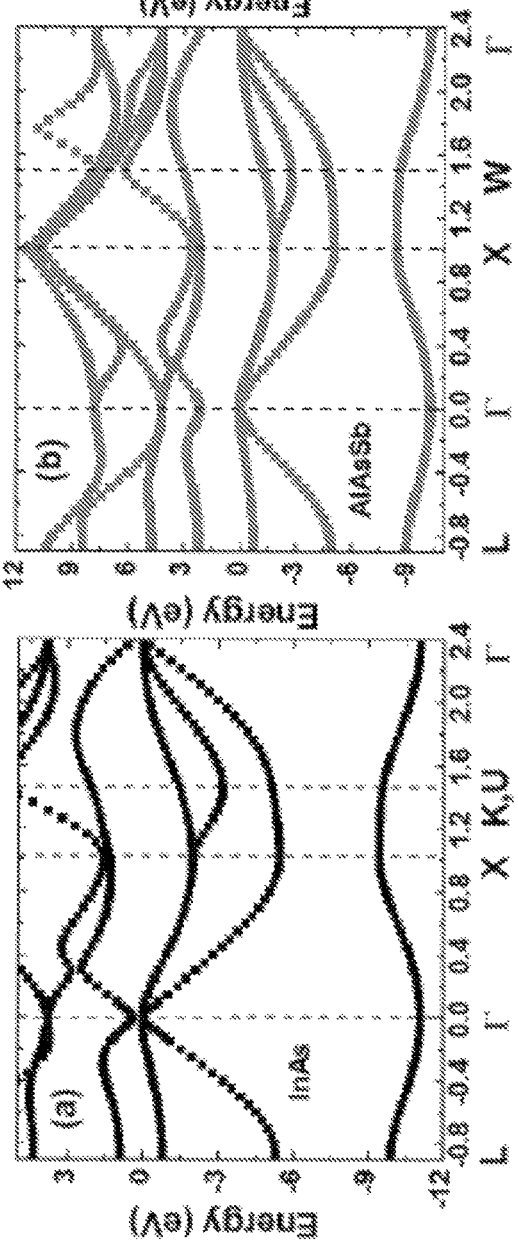
FIGS. 11A, 11B, 11C, 11D, 11E, and 11F present various bandstructure-related data.

However, the combination of empirical pseudopotential band structure and carried out ensemble Monte-Carlo calculations provided further insight into the behavior of hot carriers in these type-II InAs quantum wells. To this end, FIGS. 11A and 11B illustrate the band structures of bulk InAs and AlAsSb, respectively. Bulk InAs has a direct energy gap (Γ-valley) of 0.35 eV at 300 K, and an electron effective mass of 0.023mo. The separation of the L- and X-valleys from the top of the Γ-valley are ~ 0.7 eV and 1.45 eV, respectively, and both have significantly heavier masses of 0.29m$_o$ and 0.64m$_o$, respectively. Moreover, quantum well structures can significantly change these values, particularly at the Γ-point, where the carrier confinement is the strongest.

FIG. 11C illustrates the results of a simulation of the active region of the QW device at hand that was calculated using NRL's Multibands® software package. The conduction and valence band offsets (Γ-valley) are predicted along with the transition energies of the ground (e1) and first excited state (e2); along with the satellite L- and X-valleys in both the InAs QWs and the AlAsSb barriers. The AlAsSb barrier material is indirect therefore the X-valley constitutes the band gap of the material. FIG. 11D shows the scattering rates as a function of energy for polar optical and acoustic phonons, as well as impurity scattering rates for InAs at 300 K. Around the band gap of bulk InAs, this process is dominated by polar optical phonons.

As the energy increases, however, the contribution of acoustic phonons steadily increases as well and becomes significant in the energy range of the InAs QWs investigated here (at about 0.85 eV). The rise of the acoustic mode is helped by the mass increase in the non-parabolic bands, but it is still small as compared to the intervalley (IV) processes. The weakening of the polar optical phonon (POP) interaction at high energy has led to predictions of polar runaway (~inability to limit the energy gain from the field); this is believed to have been seen in wide band gap materials such as SiO2. FIG. 11E shows a comparison, at 300 K, of the scattering rates for both emission and absorption of polar optical and satellite valley phonons (L,X) for bulk InAs.

As the energy increases, the contribution of IV scattering becomes significant and dominates interactions with the high-energy photogenerated carriers at >0.8 eV, see FIG. 11F. Upon photoexcitation, hot carriers are rapidly scattered to the higher energy L-(predominately) and X-valley metastable states where they are 'stored', which is a process facilitated by the large mismatch in valley degeneracy that supports efficient transfer of carriers from the lower mass Γ-valley to the larger mass upper valleys. (Notably, a similar effect has been observed previously in InAs in Raman measurements as well as, in time resolved PL studies of hot carriers in GaAs QWs. As such, the thermalization of hot carriers typically mediated by the emission of LO phonons will be limited by the dynamics of the reabsorption processes of IV phonons and back scattering of the carriers from the metastable satellite valleys to the Γ-valley.)

However, the difference in valley degeneracy that supported the emission (or transfer) of hot carriers serves to inhibit their back scattering, since the transfer of heavier carriers in the upper valleys to the lower mass Γ-valley is unfavorable. This is illustrated by the dominance of the IV emission in FIG. 11E. It is will also be shown (discussed) below that such a process can be used to inhibit (or enhance) hot carrier extraction in the device architectures, too.

To understand the effect of hot carrier generation and their stability—as observed in FIGS. 10A-10D—with their relative independence from power, one could consider the energy band offsets shown in FIG. 11C and the effect of IV scattering in these material systems. Upon high-energy photoexcitation, carriers in the Γ-valley are scattered efficiently by IV phonons to the L-valley (green level) and/or the X-valley (blue) in the QWs. Carriers absorbed in the barriers and lower energy carriers rapidly relax to the ground state emitting PL from ground state of the QW (e1) via the lowest energy transition: e1-hh1. Since the high energy carriers scatter effectively independent of carrier density, the stability of the hot carrier temperature will be present at all excitation levels, irrespective of any phonon bottleneck—as observed in FIG. 10D.

The high energy tail reflects energy that is 'dumped' back into the Γ-valley carrier distribution by carriers that have been back-scattered from the satellite valleys. This effect causes significant heating of the carrier distribution of the QW ground state, which contributes to the broad high energy tail of the PL at all powers (FIGS. 10C, 10D)

Although the physical mechanism discussed above describes the behavior in these investigate material systems, in order for the effect(s) to be useful for implementing practical solar low energy photogenerated carriers must also be harnessed, along with the carriers at higher energies. To extract lower energy carriers in the intrinsic region of our material structure (FIG. 9A), the effect of high electric field is invoked that serves to increase the kinetic energy and preferentially scatter carriers into the higher valleys via the well-known Gunn effect. (This behavior has also been observed and held responsible for the large break down voltage observed in InAs HEMT structures.)

The efficiency of IV scattering aided by an electric field is depicted in FIG. 11F, which shows the occupation probability of carriers in the L-valley with respect to the Γ-valley with increasing electric field for InAs at 300 K; the occupation probability is calculated using ensemble Monte-Carlo techniques. Assuming a complete occupation of carriers in the Γ-valley at 0 kV/cm, and then increasing the electric field to E>17 kV/cm would indicate that the occupation of the carriers in the L-valley becomes preferable. In the QW device structures investigated here the electric field reaches values in excess of about 25 kV/cm. As such levels of electric field, the results depicted in FIG. 11F imply that about 60% of the low energy carriers scatter and occupy higher energy valleys. This behavior offers a novel approach for the development of practical hot carrier solar cells that are predicted to exceed 40% at 1-sun when coupled with the transfer of the photoexcited high-energy (hot) carriers and the use of the AlAsSb as the energy-selective contact.

To investigate the presence of hot carriers in the devices measured here, 1-sun and monochromatic temperature and power dependent J-V measurements were performed on the structure schematically shown in FIG. 9A; the carriers (electrons) rapidly relax into the QWs and are strongly confined by the large potential barrier in the conduction band. The escape of carriers thereafter requires either increased contribution from thermionic emission over the barrier as the lattice temperature increases, or effects due to non-equilibrium carrier temperatures—the presence of hot carriers with increasing excitation power.

Figures 12A, 12B, 12C:
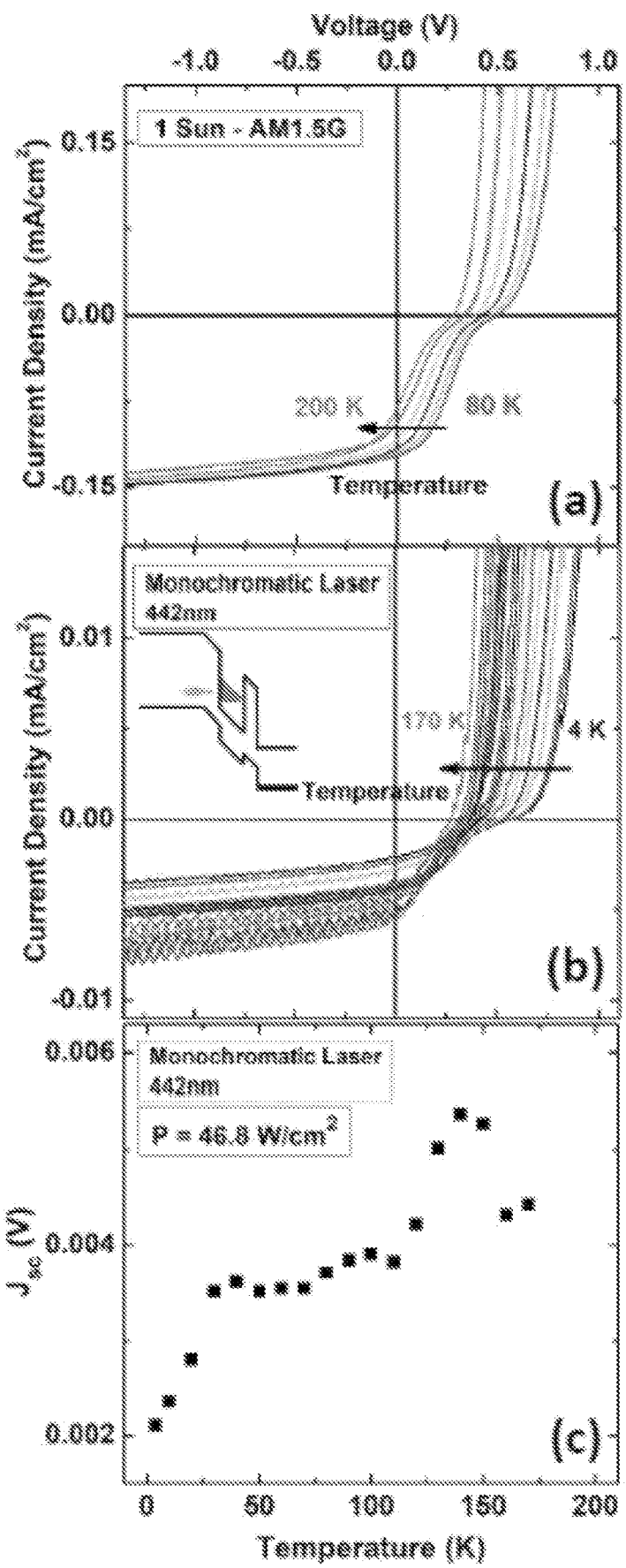
FIG. 12A: Temperature-dependent current density-voltage (J-V) curves under 1-sun AM-1.5 G conditions.
FIG. 12B: Temperature-dependent J-V curves at low power under 442 nm monochromatic excitation. The inset shows the effect on increasing the excitation power and the generation of a 'hotter' and therefore less confined carrier distribution.
FIG. 12C: Temperature-dependent short circuit current under monochromatic excitation at 442 nm: the effect of thermionic emission.

FIG. 12A illustrates the temperature dependence of the Current Density-Voltage curves (JV curves) under 1-sun AM-1.5 G. With increasing from 77 K to 200 K temperature, one can observe a simultaneous decrease in open circuit voltage ($V_{oc}$) and the magnitude of the short circuit current density ($J_{sc}$). These changes reflect a combination of the decreasing band gap, increasing thermionic emission ($J_{sc}$), and an increase in the dark current, as well as an increase in (direct) majority carrier tunneling across the narrow intrinsic region at higher fields under forward bias. Also evident from FIG. 12A is the strong inflection near the photovoltaic regime, which indicates strong minority carrier localization at voltages between about –0.1 V and $V_{oc}$. With decreasing forward bias, the magnitude of the extracted current density increases rapidly until 0.1 V. Such increase creates a total electric field across the active region of about 50 kV/cm, which is the field required for the carriers to surmount the deep conduction band confinement within the QWs in this structure.

FIG. 12B shows the temperature dependent JV curves under the 442 nm monochromatic excitation. The inset shows a schematic representing the excitation of the carriers (which rapidly relax into the QW) and the subsequent strong confinement at low powers and temperature. As the lattice temperature is increased, a monotonic increase in the extracted photocurrent is observed, which reflects the higher thermal energy of the carriers and increased thermionic emission. This is further illustrated in FIG. 12C, showing the short circuit current density $J_{sc}$ as a function of temperature for the measurements illustrated in FIG. 12B. Although the total current density is low (which reflects the low total absorption of the QWs), a steady increase in photocurrent is observed with increasing temperature.

Figures 13A, 13B:
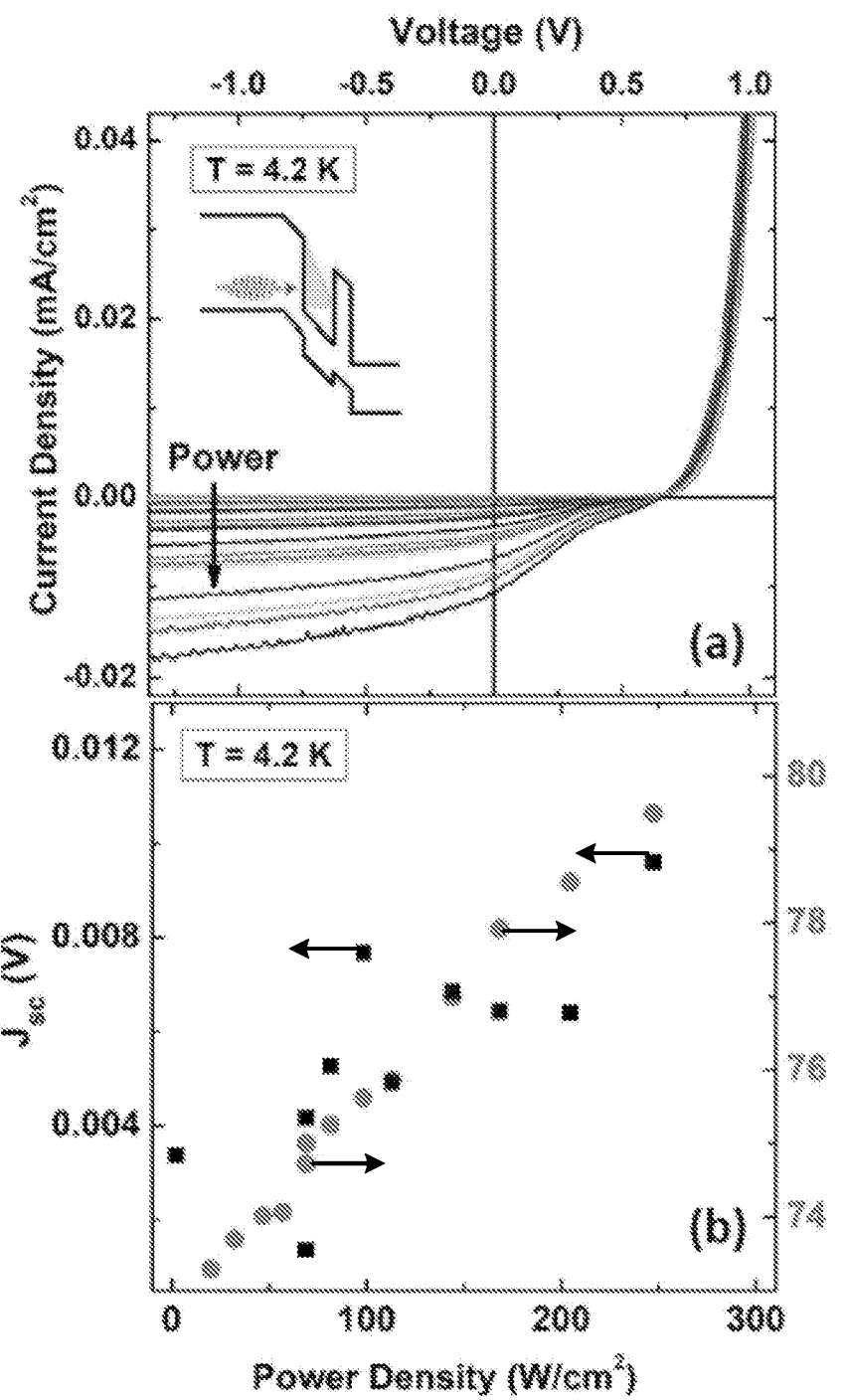
FIG. 13A: Power-dependent monochromatic (at 442 nm) J-V curves t 4.2 K. The inset shows the confinement of lower energy photoexcited carrier distribution within the QWs.
FIG. 13B: Comparison of the short circuit current and carrier temperature difference ($\Delta$T) as a function of excitation power at 4.2 K.

FIG. 13A illustrates a power-dependent study of monochromatic JV measurements performed at 4.2 K (to reduce the contribution of thermionic processes) in order to investigate solely the effect of the generation of non-equilibrium hot carriers in the QWs. A schematic of the effect of increasing power is shown as an inset to FIG. 13A, whereby increasing the excitation density broadens the carrier distribution such that (at increasing carrier temperature) the tail states can circumvent the confinement in the QW. At lower powers, the presence of an inflection point indicative of the localization of carriers is evident. As the power is increased, there is a steady increase in the $J_{sc}$ as demonstrated in FIG. 13B (showing plots representing the extracted photocurrent versus power that corresponds to the plots of FIG. 13A).

Also plotted in FIG. 13B is the carrier temperature difference ($\Delta T_C$) over the same (relatively low) power range. A clear correlation with increasing power is evident in terms of $\Delta T_C$ and $J_{sc}$, suggesting the escape of carriers is related to the non-equilibrium carrier distribution in the QWs. Again, the relative extracted photocurrents are quite low while significant carrier heating $\Delta T_C$ is observed at low powers. The fact that the total energy provided to the carrier distribution is on the order of ~ 7 meV (80 K) (while the electron confinement is large at about 1.6 eV) suggests the extracted current is related to the scattering of carriers from the e1 (GS) to the L-valley in the QW through a combination of the increasing power but, more predominantly the large electric field present in the intrinsic region of the device.

Once the carrier is transferred to the satellite valleys, their extraction becomes dependent on the band alignment between the upper valleys in the active region (InAsQW/i-AlAsSb) as well as those of the upper n-AlInAs emitter layer. The band alignment and electric field is simulated for the full device using NRL Multibands® simulation software in FIGS. 14A, 14B, 14C for biases of –0.5 V, 0 V, and +0.5 V, respectively.

Figures 14A, 14B, 14C:
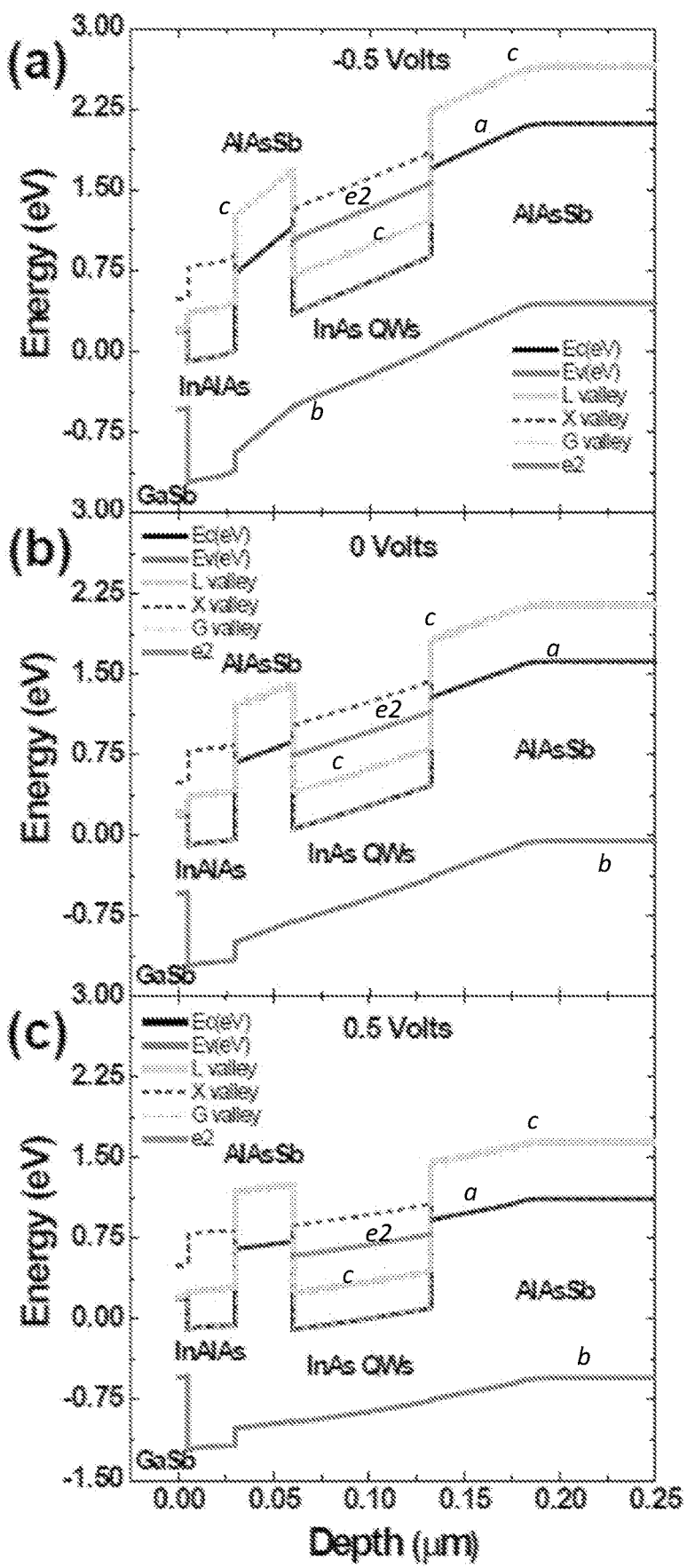
FIGS. 14A, 14B, 14C illustrate energy band offset for the full p-i-n diode structured according to an embodiment of the invention as a function of applied bias at −0.5 V, 0 V, and +0.5 V, respectively. The conduction band, the valence band, and the different valleys ($\Gamma$-, L-, X-) are indicated, as well as the excited state transition in the InAs quantum well (e2).

Prior to this Poisson-type calculation, a k·p analysis was performed to simulate the properties of the QWs in the active region, so that the average effect of which is then inserted into the full device structure as shown in FIGS. 14A-14C. The conduction band is shown in bold black lines (curves a) and the valence band in red (curves b). The Γ-valley is indicated in green (curves c), this corresponds to the ground state (e1) of the InAs QW (direct) and lowest energy (band gap) in the ntype AlInAs (direct). However, the Γ-valley is at higher energy in the indirect AlAsSb, which has an energy band gap determined by the X-valley (shown in blue across the structure). Also shown in FIGS. 14A-14C are the energy positions of the L-valley and the position of the QW excited state, e2.

Here, the origin of the inflection in the monochromatic JV curves shown in FIGS. 12B, 13A and those in the temperature dependent JV curves under 1-sun AM1.5 G shown in FIG. 12A becomes more apparent. Such inflections in the photovoltaic (PV) region typically represent the localization of minority carriers—therefore inhibited carrier collection. Typically, in QWs this is a manifestation of the energy difference between e1 of the QW and the barriers conduction band (all the more prominent in deep wells) which limits thermionic emission and/or tunneling. In photogenerating high energy carriers using the 442 nm spectral line of HeCd: the PL and hot carrier analysis shown in FIGS. 10A-10D strongly suggest high energy carriers are efficiently transferred to higher valleys—leading to inhibited hot carrier thermalization, as discussed.

However, despite the preferential nature of the IV scattering process these higher energy carriers continue to experience a parasitic barrier (as evident by the inflection point in FIGS. 12A-12C and 13A-13B. The origin of this parasitic barrier to carriers in the L- and X-valleys in the QW is attributed to the mismatch in the valley degeneracies across the InAs QW AlAsSb—AlInAs interface. That is, since the carriers in the L-valley in the InAs have a heavier mass—their scattering/transfer to the lower energy (and more importantly lower mass) Γ-valley in the AlInAs is inhibited; this provides a barrier to extraction—in addition to the AlAsSb barrier confining carriers in the QW.

As already noted above, FIGS. 14A, 14B show the band alignment of the device and the relative energy alignments in reverse and zero bias, respectively. At these applied voltages, the band bending (electric field) brings into resonance the L-valleys in the InAs QW and n-AlInAs layer; subsequently as the reverse bias (and field-aided band bending) is increased, the photogenerated minority carriers escape via tunneling. This is reflected in the J-V measurements shown in FIGS. 12B and 13A, where the inflection is removed with increased reverse bias. However, under operating conditions (e.g., the optimum $V_{oc}$ level 0.8 V) or even at voltages greater than 0.5 V (see FIG. 14C) the L-valley of the InAs QW begins to be level and move below that of the n-AlInAs region. Therefore, the carriers from the InAs QW are blocked by the L (for InAs)-to-Γ (for AlInAs) valley degeneracy mismatch: the exact process that facilitates IV scattering within the InAs QW in the first place.

As such, despite generating robust hot carriers in the QWs, the performance of the discussed embodiments of the semiconductor structures may be limited by the mismatch in valley degeneracy at the upper InAs/AlInAs—AlAsSb interface. To improve the performance of the current structure, the upper n-AlInAs could be replaced, for example, with an n-region having more favorable valley degeneracy. This would also serve to facilitate hot carrier extraction in such devices. In summary, it is shown that although the Γ-valley dominates the optical absorption and emission in InAs quantum wells, the dynamics of high energy hot carriers and their thermalization are strongly affected by the valley degeneracy both within the QW and with respect to the barriers in QW devices. In the InAs QW p-i-n diodes assessed stable hot carriers were observed at relatively low power (almost independently of power). This behavior is attributed to preferential scattering of high energy carriers to the upper satellite L- and X-valleys, which slows carrier thermalization via LO phonon emission—since back scattering of these metastable carriers is required prior to any electron-phonon coupling occurring in the Γ-valley. Although both high electric field and optical excitation are shown to enable stable hot carrier generation in the QWs, the extraction of these carriers is inhibited by the mismatch in valley degeneracy (L to Γ) across the InAs QW/n-AlInAs layers resulting in carrier localization in the QWs in the operating regime of the solar cell. Improved architectures incorporating n-AlAsSb as the upper layer are expected to improve the properties considerably.

References made throughout this specification to "one embodiment," "an embodiment," "a related embodiment," or similar language mean that a particular feature, structure, or characteristic described in connection with the referred to "embodiment" is included in at least one embodiment of the present invention. Thus, appearances of these phrases and terms may, but do not necessarily, refer to the same implementation. It is to be understood that no portion of disclosure, taken on its own and in possible connection with a figure, is intended to provide a complete description of all features of the invention.

It is also to be understood that no single drawing is intended to support a complete description of all features of the invention. In other words, a given drawing is generally descriptive of only some, and generally not all, features of the invention. A given drawing and an associated portion of the disclosure containing a description referencing such drawing do not, generally, contain all elements of a particular view or all features that can be presented is this view, for purposes of simplifying the given drawing and discussion, and to direct the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this detail in the drawing may be implied unless the context of the description requires otherwise. In other instances, well known structures, details, materials, or operations may be not shown in a given drawing or described in detail to avoid obscuring aspects of an embodiment of the invention that are being discussed.

The invention as recited in claims appended to this disclosure is intended to be assessed in light of the disclosure as a whole, including the recitations in the claims and features disclosed in prior art to which reference is made.

For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. In one specific case, the terms "approximately", "substantially", and "about", when used in reference to a numerical value, represent a range of plus or minus 20% with respect to the specified value, more preferably plus or minus 10%, even more preferably plus or minus 5%, most preferably plus or minus 2% with respect to the specified value. As a non-limiting example, two values being "substantially equal" to one another implies that the difference between the two values may be within the range of +/−20% of the value itself, preferably within the +/−10% range of the value itself, more preferably within the range of +/−5% of the value itself, and even more preferably within the range of +/−2% or less of the value itself.

The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes.

Modifications to, and variations of, the illustrated embodiments may be made without departing from the inventive concepts disclosed herein. Furthermore, disclosed aspects, or portions of these aspects, may be combined in ways not listed above. For example, related embodiments of the invention provide a photovoltaic device that includes first and second layers to form a p-n junction configured such that substantially all of a depletion region is located on that side of the p-n junction that is defined by the absorbing layer of the device. One of the first and second layers includes such absorber layer (which is configured, in operation of the device, to congregate a substantial majority of photo-generated carriers at a first meta-stable energy level that is higher than an energy level of a bottom of direct-gap conduction band of the material of the absorber layer). The absorber layer is under material strain defined to substantially match a lattice constant of the absorber layer to a lattice constant of another of the first and second layers. The semiconductor structure of this embodiment also includes a third layer that adjoins the absorber layer, that is configured as a semi-infinite energy collector, and that has a corresponding band gap defined by i) a valence band that lies below a valence band of the absorber layer, and/or ii) a conduction band at an energy level substantially equal to the first meta-stable energy level. Notably, the third layer in substantially thinner than the absorbing layer. In a specific implementation of this embodiment, the third layer may be doped with a dopant at a concentration that causes a quasi-Fermi level of the L satellite valley of the band structure of the absorber layer to substantially align with a quasi-Fermi level of the third layer. In any of the above-identified related embodiments, the absorber layer may be dimensioned to have a first thickness with a value that is smaller than a value of the second thickness (of the depletion region of the device) and a value of the third thickness (defined such as to be sufficient for substantial relaxation of strain to a level below 0.10%). In substantially any of the above-identified related embodiments, at least one of the following conditions may be satisfied: a) the thickness of the third layer is about 10 nm; b) the thickness of the absorber layer is about 200 nm; and c) the electric field caused by a built-in electric potential of the p-n junction at an interface between the absorber layer and the third layer substantially exceeds 10 kV/cm. Alternatively or in addition, substantially any of the above-identified embodiments may additionally include a contact layer of degenerate semiconductor material, while the third layer is sandwiched between the absorber layer and such layer of degenerate semiconductor material. (In this latter case, the third layer may be configured to terminate the depletion region.)

Operation of an embodiment of a photovoltaic device (such as the HCSC) configured according to the above-disclosed principles may include the steps of i) collecting a substantial majority of photo-generated carriers at at least one first energy level that is higher than an energy level corresponding to a bottom of a conduction band of an absorbing layer of the device; and transferring such substantial majority of the photo-generated carriers to a second energy level that represents a bottom of the conduction band of a carrier-extraction layer of the device. (Here, a band-gap of the carrier-extraction layer is defined such as to make the second energy level to be substantially equal to the at least one first energy level.) The method for operating the device additionally includes the step of removing an electric charge of the transferred photo-generated carriers through a layer of degenerate semiconductor in contact with the carrier-extraction layer. In a specific case, the step of collecting may include returning photo-generated carriers that relaxed to the bottom of the conduction band of the absorbing layer to the at least one first energy level as a result of the absorbing layer being thinner than a depletion layer of a p-n junction of the device.

Accordingly, the invention should not be viewed as being limited to the disclosed embodiment(s). In addition, the terminology used herein is with the purpose of describing particular embodiments only, and is not intended to limit the scope of the present invention.

The invention claimed is:

1. A photovoltaic device comprising:
a growth substrate;
a heavily-doped p-type layer deposited on the growth substrate, wherein the p-type layer is doped at a dopant concentration greater than $10^{18}$ cm$^{-3}$, wherein the p-type layer comprises an aluminum arsenic antimonide (AlAsSb) or an indium aluminum arsenide (InAlAs);
a lightly-doped n-type absorption layer deposited over the p-type layer and comprising a band structure that substantially matches the solar spectrum and comprising a plurality of valleys, wherein the absorption layer is doped at a dopant concentration of less than $10^{16}$ cm$^{-3}$, wherein the absorption layer comprises an indium gallium arsenide (InGaAs) or an InAlAs;
a heavily-doped n-type carrier-collector layer deposited over the lightly-doped n-type absorption layer, wherein the carrier-collector layer is doped at a dopant concentration greater than $10^{18}$ cm$^{-3}$, wherein the carrier-collector layer comprises an AlAsSb or an InAlAs and has a thickness less than a thickness of the absorption layer, wherein the carrier-collector layer further comprises a conduction band having a bottom, and wherein the bottom is substantially equal to an energy level of at least one upper valley of the plurality of valleys; and
a contact layer comprising a degenerate semiconductor material deposited on a surface of the carrier-collector layer, wherein the absorption layer has a thickness in a range of about 180 nanometers (nm) to about 220 nm.

2. The photovoltaic device of claim 1, wherein the p-type layer comprises AlAsSb, the absorption layer comprises InAlAs, and the carrier-collector layer comprises AlAsSb.

3. The photovoltaic device of claim 1, wherein the p-type layer comprises AlAsSb, the absorption layer comprises InGaAs, and the carrier-collector layer comprises InAlAs.

4. The photovoltaic device of claim 1, wherein the p-type layer comprises InAlAs, the absorption layer comprises InGaAs, and the carrier-collector layer comprises InAlAs.

5. The photovoltaic device of claim 1, wherein the p-type layer comprises AlAsSb and the carrier-collector layer comprises InAlAs.

6. The photovoltaic device of claim 1, wherein the p-type layer comprises InAlAs and the carrier-collector layer comprises InAlAs.

7. The photovoltaic device of claim 1, wherein the p-type layer comprises AlAsSb, the absorption layer comprises InGaAs, and the carrier-collector layer comprises AlAsSb.

8. The photovoltaic device of claim 1, wherein the p-type layer comprises InAlAs, the absorption layer comprises InGaAs, and the carrier-collector layer comprises AlAsSb.

9. The photovoltaic device of claim 1, wherein the p-type layer comprises AlAsSb and the carrier-collector layer comprises AlAsSb.

10. The photovoltaic device of claim 1, wherein the p-type layer comprises InAlAs and the carrier-collector layer comprises AlAsSb.

11. The photovoltaic device of claim 1, further comprising an auxiliary layer between the absorption layer and the carrier-collector layer.

\* \* \* \* \*